United States Patent
Kitamoto

(10) Patent No.: US 6,621,327 B2
(45) Date of Patent: Sep. 16, 2003

(54) SUBSTRATE VOLTAGE SELECTION CIRCUIT

(75) Inventor: Ayako Kitamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/345,340

(22) Filed: Jan. 16, 2003

(65) Prior Publication Data

US 2003/0102902 A1 Jun. 5, 2003

Related U.S. Application Data

(62) Division of application No. 09/860,579, filed on May 21, 2001, now abandoned.

(30) Foreign Application Priority Data

Jul. 14, 2000  (JP) ......................................... 2000-214572

(51) Int. Cl.[7] .............................................. G05F 3/02
(52) U.S. Cl. ..................................... 327/537; 327/534
(58) Field of Search ................................ 327/534, 537

(56) References Cited

U.S. PATENT DOCUMENTS

| 5,461,338 A | | 10/1995 | Hirayama et al. | |
|---|---|---|---|---|
| 5,594,381 A | * | 1/1997 | Bingham | 327/534 |
| 5,610,533 A | | 3/1997 | Arimoto et al. | |
| 5,703,522 A | * | 12/1997 | Arimoto et al. | 327/534 |
| 5,838,047 A | | 11/1998 | Yamauchi et al. | |
| 5,917,365 A | * | 6/1999 | Houston | 327/534 |
| 6,046,627 A | * | 4/2000 | Itoh et al. | 327/546 |
| 6,097,113 A | * | 8/2000 | Teraoka et al. | 307/125 |

FOREIGN PATENT DOCUMENTS

| JP | 60-10656 | 1/1985 |
|---|---|---|
| JP | 6-089574 | 3/1994 |

* cited by examiner

*Primary Examiner*—Terry D. Cunningham
(74) *Attorney, Agent, or Firm*—Arent Fox Kintner Plotkin & Kahn, PLLC

(57) ABSTRACT

Transistors are supplied with either a first power supply voltage or a second power supply voltage lower than the first power supply voltage. During an operation period of the transistors, substrate voltages of the transistors are set at a value between the first power supply voltage and the second power supply voltage. The substrate voltages are changed to lower threshold voltages of the transistors so that the transistors improve in drivability and operating speed. Therefore, neither a booster for generating higher voltages nor a pumping circuit for generating negative voltages is particularly required. This allows a reduction in layout size. Besides, in accordance with the operating state of the semiconductor integrated circuit, the transistor characteristics can be easily changed by changing the threshold voltages of the transistors.

4 Claims, 17 Drawing Sheets

SUBSTRATE VOLTAGE SELECTION CIRCUIT

This is a Division of application Ser. No. 09/860,579 filed on May 21, 2001 now abandoned. The disclosure of the prior application is hereby incorporated by reference herein in its entirety.

BACKGROUND OF THE INVENTION

1. Field of the Invention

The present invention relates to a semiconductor integrated circuit having transistors, and more particularly to a semiconductor integrated circuit which operates at lower voltage.

2. Description of the Related Art

Recently, the power supply voltages (operation voltages) of semiconductor integrated circuits have been lowering because of finer transistor structures, reduced power consumption, and so forth. On the other hand, threshold voltages of transistors have little dependence on the power supply voltages. Therefore, as the power supply voltage lowers, the threshold voltages of the transistors with respect to the power supply voltages relatively goes high. As a result, transistors have decreased in operating speed, with increased difficulties in obtaining desired characteristics.

The threshold voltage of a transistor varies with a change in the substrate voltage of the transistor. Specifically, the threshold voltage increases with the backward bias of the pn junction between the source and substrate going higher. Higher threshold voltages of transistors lower the drivabilities of the transistors while reducing non-operation leak currents in the transistors.

Japanese Unexamined Patent Application Publication No. Sho 60-10656 and Japanese Unexamined Patent Application Publication No. Hei 6-89574 disclose examples of changing substrate voltages of transistors in a non-operation state (standby state) and an operation state. According to the semiconductor integrated circuits disclosed in these publications, a plurality of substrate voltage generators for generating different substrate voltages are formed on an integrated circuit, and the substrate voltage generators are switched for use in non-operation periods and operation periods. Then, in the non-operation periods, the threshold voltages of transistors are heightened to reduce leak currents. In the operation periods, the threshold voltages of the transistors are lowered, which enhances the drivabilities and the operating speed of the transistors.

Such conventional semiconductor integrated circuits have had a problem, however, that the plurality of substrate voltage generators have to be formed on a chip with an increase in layout area. In particular, when the circuits are composed of CMOSs, the pMOS transistors and the nMOS transistors each require two substrate voltage generators.

Moreover, semiconductor integrated circuits commonly implement a power-on resetting circuit. The power-on resetting circuit is actuated upon the startup of a power supply so that internal circuits are initialized to avoid malfunctions of the semiconductor integrated circuit. This type of power-on resetting circuit utilizes a threshold voltage of a transistor for detecting that the power supply voltage reaches a predetermined value, and generating a power-on resetting signal. If the threshold voltage of the transistor becomes relatively high with respect to the power supply voltage, the power-on resetting signal might not be generated properly. This can preclude normal initialization of the internal circuits and cause the semiconductor integrated circuit to malfunction.

Furthermore, the lowering in transistor operation voltage requires that substrate voltages be hereafter generated with accuracy in steps of e.g. several hundreds of millivolts, not in steps of 1 V as heretofore.

SUMMARY OF THE INVENTION

An object of the present invention is to reduce the consumption current of a transistor during standby periods and improve the drivability of the transistor during operation periods without increasing the layout size.

Another object of the present invention is to reduce the consumption current of a transistor during standby periods and improve the drivability of the transistor during operation periods in the cases where the transistor has a relatively high threshold voltage with respect to its power supply voltage.

Still another object of the present invention is to change the threshold voltage of a transistor in accordance with the operating state of the semiconductor integrated circuit, and to modify transistor characteristics.

Another object of the present invention is to accurately generate substrate voltages to be supplied to transistor substrates.

According to one aspect of the present invention, transistors are supplied with either a first power supply voltage or a second power supply voltage lower than the first power supply voltage. During an operation period of the transistors, substrate voltages of the transistors are set at a value between the first power supply voltage and the second power supply voltage. The substrate voltages are changed to lower threshold voltages of the transistors so that the transistors improve in drivability and operating speed. Therefore, neither a booster for generating higher voltages nor a pumping circuit for generating negative voltages is particularly required. This allows a reduction in layout size. Besides, in accordance with the operating state of the semiconductor integrated circuit, the transistor characteristics can be easily changed by changing the threshold voltages of the transistors. The substrate voltages are set at a value between the first power supply voltage and the second power supply voltage depending on a capacitance ratio. Therefore, it is possible to generate substrate voltages with constant values.

According to another aspect of the present invention, the substrate voltages of the transistors are set at a value at the center of the first power supply voltage and the second power supply voltage. A difference between the first power supply voltage and the substrate voltages is equal to a difference between the second power supply voltage and the substrate voltages. Therefore, variations in the threshold voltages of transistors supplied with the first power supply voltage can be set equal to variations in the threshold voltages of transistors supplied with the second power supply voltage.

According to another aspect of the semiconductor integrated circuit in the present invention, the substrate voltages of the transistors are set at either the first power supply voltage or the second power supply voltage during a non-operation period (standby period) of the transistors. The threshold voltages of the transistors during the non-operation period become higher than during the operation period. This reduces leak currents in the transistors during the non-operation period.

According to another aspect of the semiconductor integrated circuit in the present invention, the transistors include a pMOS transistor supplied with the first power supply voltage at its source electrode and an nMOS transistor supplied with the second power supply voltage at its source electrode. A substrate voltage of the pMOS transistor and a substrate voltage of the nMOS transistor are set at a value between the first power supply voltage and the second power supply voltage during an operation period of the transistors. The operation speed of the transistors improves by changing the substrate voltages during the operation periods of the pMOS transistor and the nMOS transistor in order to lower threshold voltages of the transistors.

According to another aspect of the semiconductor integrated circuit in the present invention, the pMOS transistor and the nMOS transistor have lower forward biases between the respective sources and substrates during the operation period than built-in potentials of the pn junctions between the respective sources and substrates. Therefore, no forward current (leak current) occurs on the pn junctions when the substrate voltages of the PMOS transistor and the nMOS transistor are set at a value between the first power supply voltage and the second power supply voltage. The absence of leak currents precludes fluctuations in substrate voltage. Accordingly, the threshold voltages of the transistors are maintained at a predetermined value, with no variations in the drivabilities of the transistors. In addition, a current increase caused by turning-on of the pn junctions, latch-up, and the like are prevented from occurring.

According to another aspect of the semiconductor integrated circuit in the present invention, the substrate voltage of the pMOS transistor and the substrate voltage of the nMOS transistor are set at a value at the center of the first power supply voltage and the second power supply voltage during the operation period of the transistors. Therefore, differences (margins) between the source-to-substrate voltages of the transistors and the built-in potentials can be equally large. It is also possible to equalize variations in the threshold voltages of the transistors during the operation period.

According to another aspect of the semiconductor integrated circuit in the present invention, the substrate voltage of the pMOS transistor and the substrate voltage of the nMOS transistor are set equal to each other during the operation period of the transistors. Thus, the substrate voltages are set at a value between the first power supply voltage and the second power supply voltage by, for example, connecting the substrate of the PMOS transistor and the substrate of the nMOS transistor to each other.

According to another aspect of the semiconductor integrated circuit in the present invention, the substrate voltage of the pMOS transistor and the substrate voltage of the nMOS transistor are respectively set at the first power supply voltage and the second power supply voltage during the non-operation period of the transistors. The threshold voltages of the transistors are higher than during the operation period. This reduces leak currents in the transistors during the non-operation period.

According to another aspect of the semiconductor integrated circuit in the present invention, a voltage higher than the first power supply voltage is temporarily supplied to a substrate of the pMOS transistor when the substrate voltage of the pMOS transistor is generally set at the first power supply voltage. Therefore, when the pMOS transistor shifts from an operation state to a non-operation state, its substrate voltage swiftly turns to the first power supply voltage.

According to another aspect of the semiconductor integrated circuit in the present invention, the semiconductor integrated circuit includes a capacitor charged by applying a voltage higher than the first power supply voltage. When the substrate voltage of the pMOS transistor is set at the first power supply voltage, the substrate of the pMOS transistor is connected to the capacitor. As a result, the substrate voltage of the pMOS transistor turns to the first power supply voltage through the use of the charge stored in the capacitor. That is, the capacitor assists in setting the substrate voltage at the first power supply voltage.

According to another aspect of the semiconductor integrated circuit in the present invention, a voltage lower than the second power supply voltage is temporarily supplied to the substrate of the nMOS transistor when the substrate voltage of the nMOS transistor is generally set at the second power supply voltage. Therefore, when the nMOS transistor shifts from an operation state to a non-operation state, its substrate voltage swiftly turns to the second power supply voltage.

According to another aspect of the semiconductor integrated circuit in the present invention, the semiconductor integrated circuit includes a capacitor charged by applying a voltage lower than the second power supply voltage. When the substrate voltage of the nMOS transistor is set at the second power supply voltage, the substrate of the nMOS transistor is connected to the capacitor. As a result, the substrate voltage of the nMOS transistor turns to the second power supply voltage through the use of the charge stored in the capacitor. That is, the capacitor assists in setting the substrate voltage at the second power supply voltage.

According to another aspect of the semiconductor integrated circuit in the present invention, the substrate of the pMOS transistor and the substrate of the nMOS transistor are connected to each other during the operation period of the pMOS transistor and the nMOS transistor. The substrate voltages can be easily set at a value between the first power supply voltage and the second power supply voltage by short-circuiting the substrates of the pMOS transistor and the nMOS transistor to each other.

According to another aspect of the semiconductor integrated circuit in the present invention, the substrate of the pMOS transistor and the substrate of the nMOS transistor, which are charged by applying different voltages, are connected to each other during the operation period of the pMOS transistor and the nMOS transistor. The charges stored in the substrates are shared in accordance with a junction capacitance ratio between the substrates, whereby the substrate voltages easily become equal to each other. Besides, the substrate voltages can be set at a desired value in accordance with a junction capacitance ratio between the pMOS transistor and the nMOS transistor.

According to another aspect of the semiconductor integrated circuit in the present invention, the semiconductor integrated circuit includes a capacitor charged by applying a predetermined voltage. During the operation period of the transistors, the substrates of the transistors are connected to the charged capacitor, thereby obtaining a predetermined voltage. Therefore, the substrate voltages can be set at a desired value in accordance with the junction capacitance and the junction capacitance ratios of the transistor substrates.

According to another aspect of the semiconductor integrated circuit in the present invention, the semiconductor integrated circuit includes an nMOS transistor. A substrate of the nMOS transistor is supplied with an external power supply voltage until the power supply voltage reaches a predetermined value, the external power supply voltage being supplied from exterior. Alternatively, a substrate of the nMOS transistor is supplied with an internal power supply voltage until the internal power supply voltage reaches a predetermined voltage, the internal power supply voltage being generated from the external power supply voltage. This lowers the threshold voltage of the nMOS transistor upon the startup of the power supply. For example, when the semiconductor integrated circuit has a power-on resetting circuit, which utilizes the threshold voltage of the nMOS transistor to generate a power-on resetting signal, then it is possible to advance the transition edge (inactivation timing) of the power-on resetting signal. On this account, the power-on resetting signal can be generated with reliability, particularly when the threshold voltage of the nMOS transistor is relatively high with respect to the power supply voltage or the internal power supply voltage.

According to another aspect of the semiconductor integrated circuit in the present invention, the semiconductor integrated circuit includes a pMOS transistor. A substrate of the pMOS transistor is supplied with a ground voltage until an external power supply voltage reaches a predetermined value. Alternatively, a substrate of the pMOS transistor is supplied with a ground voltage until an internal power supply voltage generated from the external power supply voltage reaches a predetermined voltage. This lowers the threshold voltage of the pMOS transistor upon the startup of the power supply. For example, when the semiconductor integrated circuit has a power-on resetting circuit, which utilizes the threshold voltage of the pMOS transistor to generate a power-on resetting signal, then it is possible to advance the transition edge (inactivation timing) of the power-on resetting signal. On this account, the power-on resetting signal can be generated with reliability, particularly when the threshold voltage (in absolute value) of the pMOS transistor is relatively high with respect to the power supply voltage or the internal power supply voltage.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

FIGS. 1 through 6 show a first embodiment of the semiconductor integrated circuit in the present invention. The semiconductor integrated circuit is formed on a p-type silicon substrate by using CMOS processes. Here, description will be given of the case where the present invention is applied to a DRAM.

Figure 1:
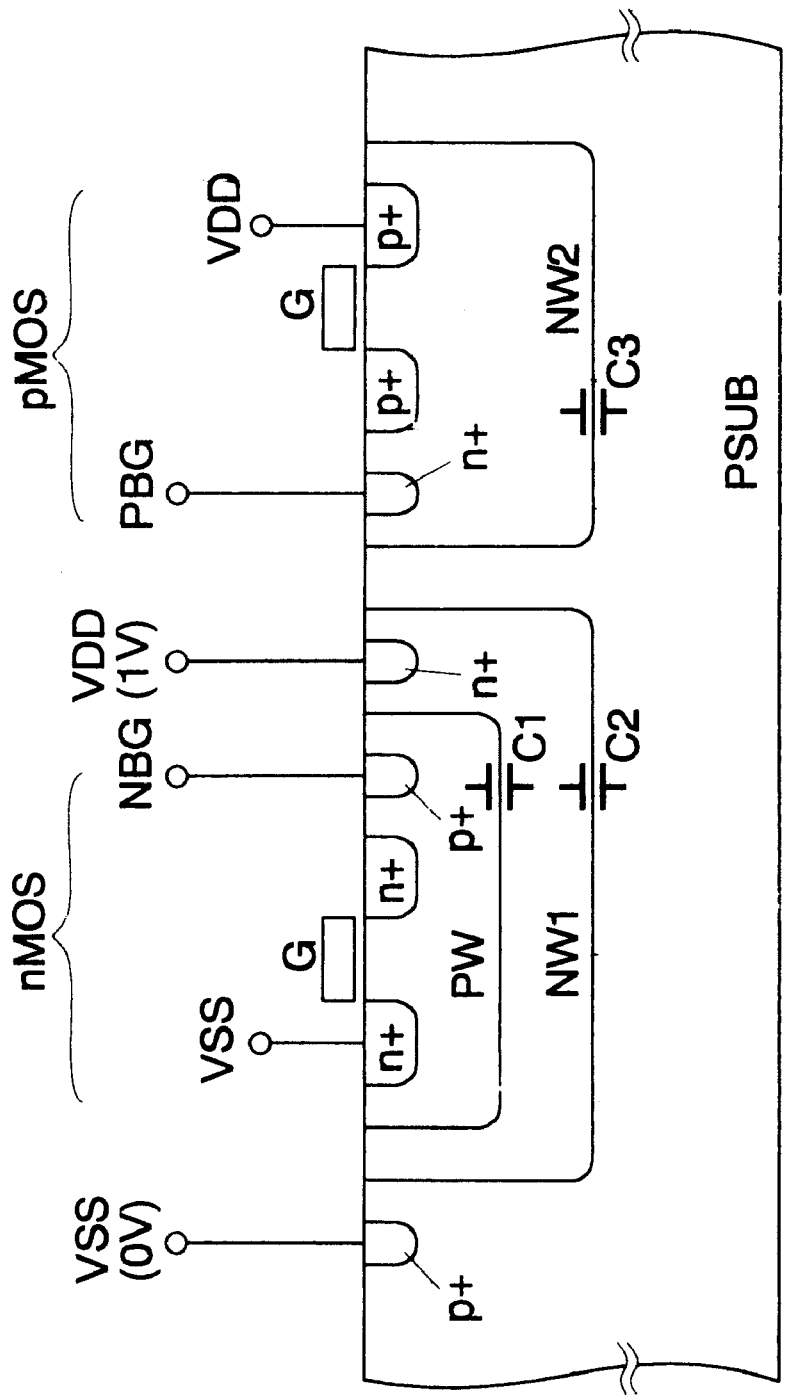
FIG. 1 is a sectional view of a substrate according to a first embodiment of the semiconductor integrated circuit in the present invention.

FIG. 1 shows a part of the sectional structure of this DRAM. Field oxide films (isolation regions), wiring on the substrate, interlevel insulators, and the like are omitted from the drawings.

N-type impurities are implanted into a p-type substrate PSUB to form an n well NW1 and a substrate region of a pMOS transistor, or an n well NW2. P-type impurities are implanted into the n well NW1 to form a substrate region of an nMOS transistor, or a p well PW. The structure in which one well region (p well PW, in this example) and the substrate PSUB are thus isolated from each other is usually referred to as triple well structure. The formation of the triple well structure facilitates the electric isolation between the substrate region of the nMOS transistor and the substrate PSUB. The substrate PSUB is connected to a ground line VSS (0 V) through a diffusion region (p+ layer) into which p-type impurities are implanted. Hereinafter, nMOS transistors and pMOS transistors will be simply referred to as nMOSs and pMOSs, respectively.

The source and drain (both n+ layers) of the nMOS are formed by implanting n-type impurities into the p well PW. The source of the nMOS is connected to the ground line VSS (0V). Then, the gate G of the nMOS is formed on the channel region between the source and drain (it grows on a not-shown oxide film). The source and drain (both p+ layers) of the pMOS are formed by implanting p-type impurities into the n well NW2. The source of the pMOS is connected to an internal power supply line VDD (1 V, for example). Then, the gate G of the pMOS is formed on the channel region between the source and drain (it grows on a not-shown oxide film). The voltage supplied to the internal power supply line VDD (hereinafter, referred to as internal power supply voltage VDD) is generated by regulating an external power supply voltage (2 V, for example) supplied from the exterior of the DRAM. Here, the internal power supply voltage VDD and the ground voltage VSS correspond to the first power supply voltage and the second power supply voltage, respectively.

The n well NW1 is connected to the internal power supply line VDD (1 V, for example) through a diffusion region (n+ layer) into which n-type impurities are implanted. The p well PW (the substrate of the nMOS) is connected to a node NBG through a p-type diffusion region (p+ layer). The n well NW2 (the substrate of the pMOS) is connected to a node PBG through an n-type diffusion region (n+ layer).

A pn-junction capacitor C1 is formed across the boundary of the p well PW and the n well NW1. A pn-junction capacitor C2 is formed across the boundary of the n well NW1 and the substrate PSUB. A pn-junction capacitor C3 is formed across the boundary of the n well NW2 and the substrate PSUB.

Figure 2:
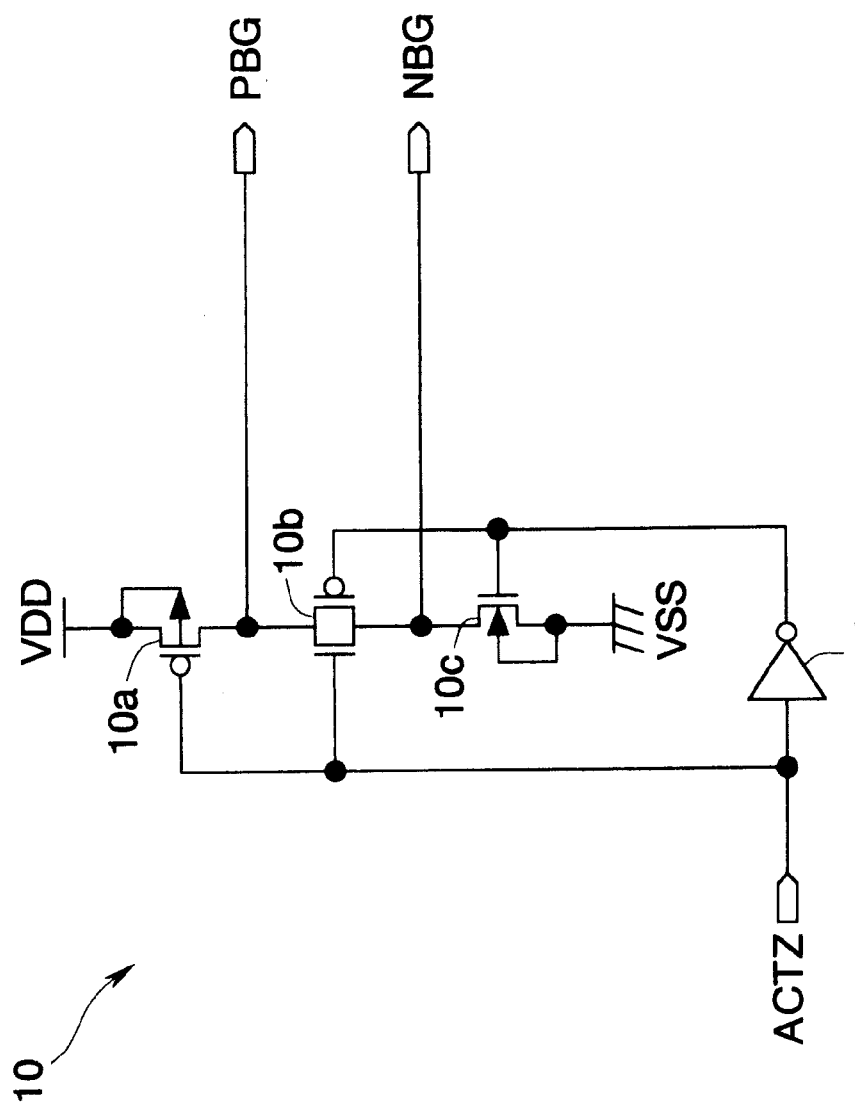
FIG. 2 is a circuit diagram showing a switching circuit in the first embodiment.
Figure 3:
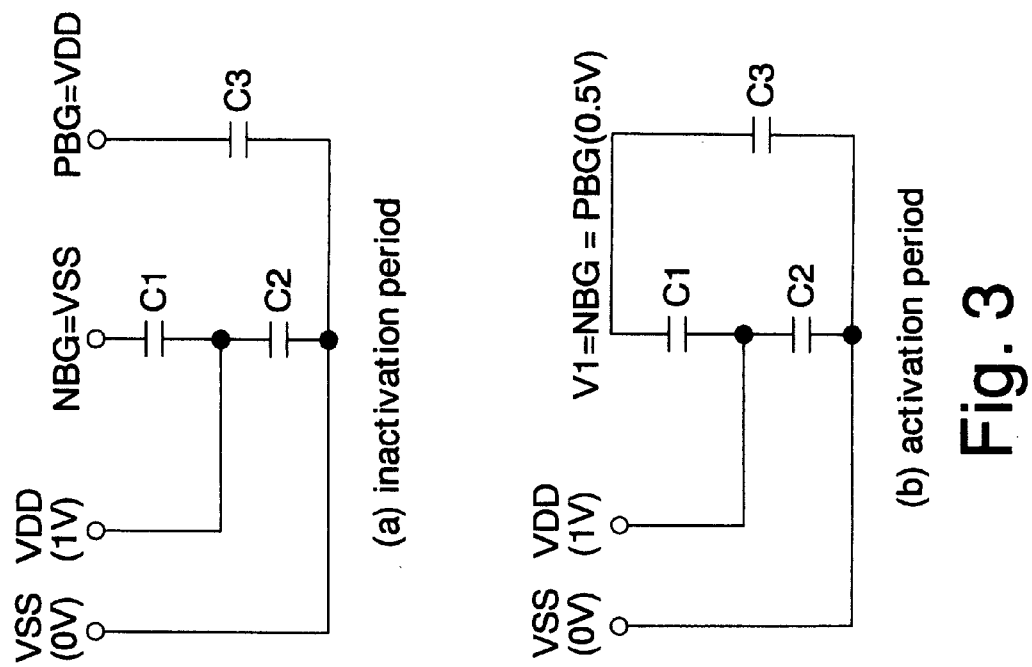
FIGS. 3(a) and 3(b) are equivalent circuit diagrams pertaining to the capacitors in FIG. 1.

FIG. 2 shows a switching circuit 10 for generating the voltages on the node NBG connected to the nMOS substrate (PW) and the node PBG connected to the pMOS substrate (NW2).

The switching circuit 10 includes a pMOS 10a, a CMOS transmission gate 10b, and an nMOS 10c which are connected in series between the internal power supply line VDD and the ground line VSS. The switching circuit 10 also includes an inverter 10d. The substrate of the pMOS 10a is connected to the internal power supply line VDD. The substrate of the nMOS 10c is connected to the ground line VSS. The node PBG is connected to the drain of the pMOS 10a, and the node NBG is connected to the drain of the nMOS 10c. The gate of the pMOS 10a and the gate of the nMOS in the CMOS transmission gate 10b receive an activating signal ACTZ. The gate of the nMOS 10c and the gate of the pMOS in the CMOS transmission gate 10b receive the inverted signal of the activating signal ACTZ through the inverter 10d.

The activating signal ACTZ is turned to high level when the DRAM is activated and internal circuits, for example, necessary for a read/write operation operate. That is, during an activation period (operation period) of the internal circuits, the pMOS 10a and nMOS 10c are turned off and the CMOS transmission gate 10b is turned on. Here, the nodes PBG and NBG are connected to each other, having the same voltage. Now, the activating signal ACTZ is turned to low level when the DRAM is inactivated and the internal circuits stop operating (standby state). That is, during an inactivation period (non-operation period) of the internal circuits, the pMOS 10a and nMOS 10c are turned on and the CMOS transmission gate 10b is turned off. Here, the node PBG has the internal power supply voltage VDD, and the node NBG the ground voltage VSS.

FIGS. 3(a) and 3(b) show equivalent circuits pertaining to the junction capacitors C1, C2, and C3 in FIG. 1. Since the capacitor C2 does not have voltage variations at both ends during the inactivation period and the activation period, description thereof will be omitted.

As shown in FIG. 3(a), in the inactivation period, the both ends of the junction capacitors C1 and C3 are respectively supplied with the ground voltage VSS and the internal power supply voltage VDD, thereby charging the junction capacitors C1 and C3. The source of the pMOS and the source of the nMOS shown in FIG. 1 are connected to the internal power supply line VDD and the ground line VSS, respectively. Therefore, during the inactivation period, both the pMOS and the nMOS have a source-to-substrate voltage of 0 V.

As shown in FIG. 3(b), in the activation period, the nodes NBG and PBG are connected to each other. Therefore, the charges stored in the junction capacitors C1 and C3 are shared in accordance with the ratio between the junction capacitors C1 and C3, whereby the nodes NBG and PBG have the same voltage V1. The voltage V1 of the nodes NBG and PBG is given by the equation (1):

$$V1=(VDD \cdot C3+VSS \cdot C1)/(C1+C3) \quad (1)$$

In this embodiment, the layout sizes of the well regions PW and NW2 are determined so that the junction capacitors C1 and C3 become equal to each other. Consequently, from the equation (1), the voltage V1 of the nodes NBG and PBG falls on the value at the center of the internal power supply voltage VDD (1 V) and the ground voltage VSS (0 V), or 0.5 V. Here, the pMOS and the nMOS have source-to-substrate voltages of 0.5 V and −0.5 V, respectively. In other words, during the activation period, both the pn junctions across the respective sources and substrates of the pMOS and the nMOS undergo 0.5 V forward. The pn junctions have, however, a built-in potential Vbi of approximately 0.6 V higher than the above voltages |0.5V|. This prevents the forward currents from flowing. That is, the nodes NBG and PBG are connected to each other so that the nMOS and the pMOS have lower forward biases between the respective sources and substrates than the built-in potential Vbi of the pn junctions, thereby avoiding the occurrence of leak currents. Moreover, neither a booster nor a negative voltage generator such as a pumping circuit is required for changing the substrate voltages.

As described above, the threshold voltages of the pMOS and the nMOS become high in the inactivation period (non-operation period) and low in the activation period (operation period). Consequently, during the inactivation period, the leak currents from the pMOS and nMOS decrease to lower the power consumption. During the activation period, the PMOS and the nMOS improve in operating speed.

Figure 4:
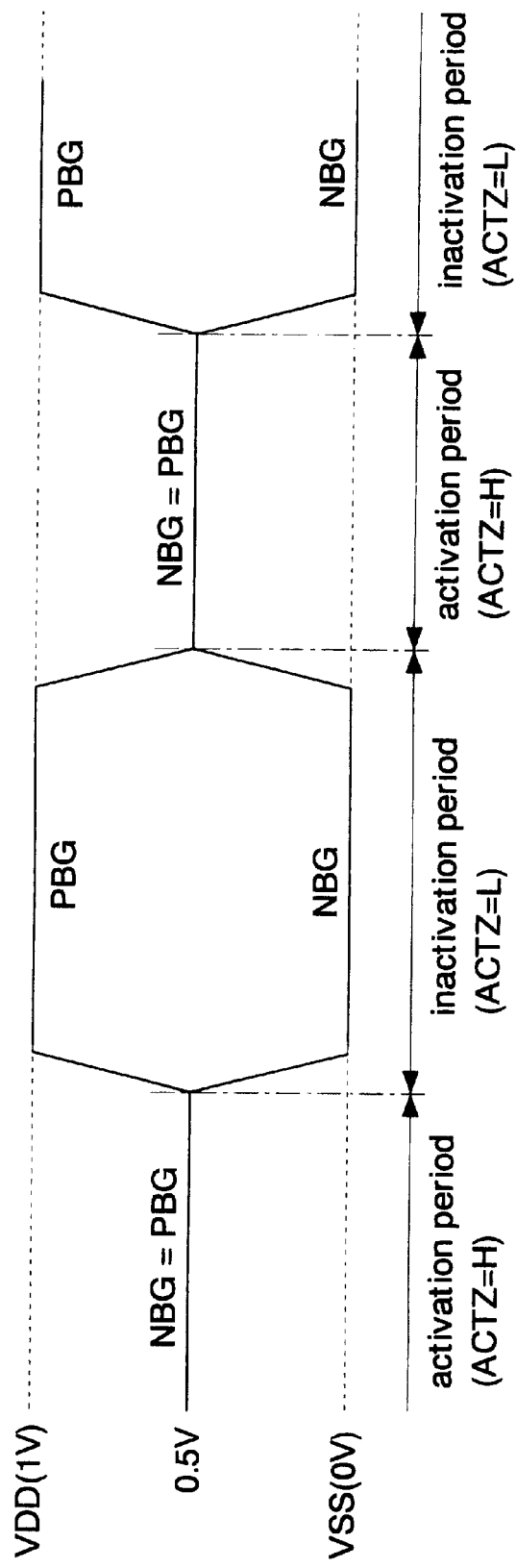
FIG. 4 is an explanatory diagram showing variations in the substrate voltages during an activation period and an inactivation period in the first embodiment.

FIG. 4 shows variations in the substrate voltages during the activation period and the inactivation period.

In the activation period, both the nodes NBG and PBG have 0.5 V in voltage. When the activating signal ACTZ is turned to low level to inactivate the internal circuits of the DRAM (the inactivation period), the node PBG have the internal power supply voltage VDD (1 V) and the node NBG the ground voltage VSS (0 V). When the activating signal ACTZ is turned to high level again to activate the internal circuits, the nodes PBG and NBG become equal to each other in voltage (0.5 V).

Figure 5:
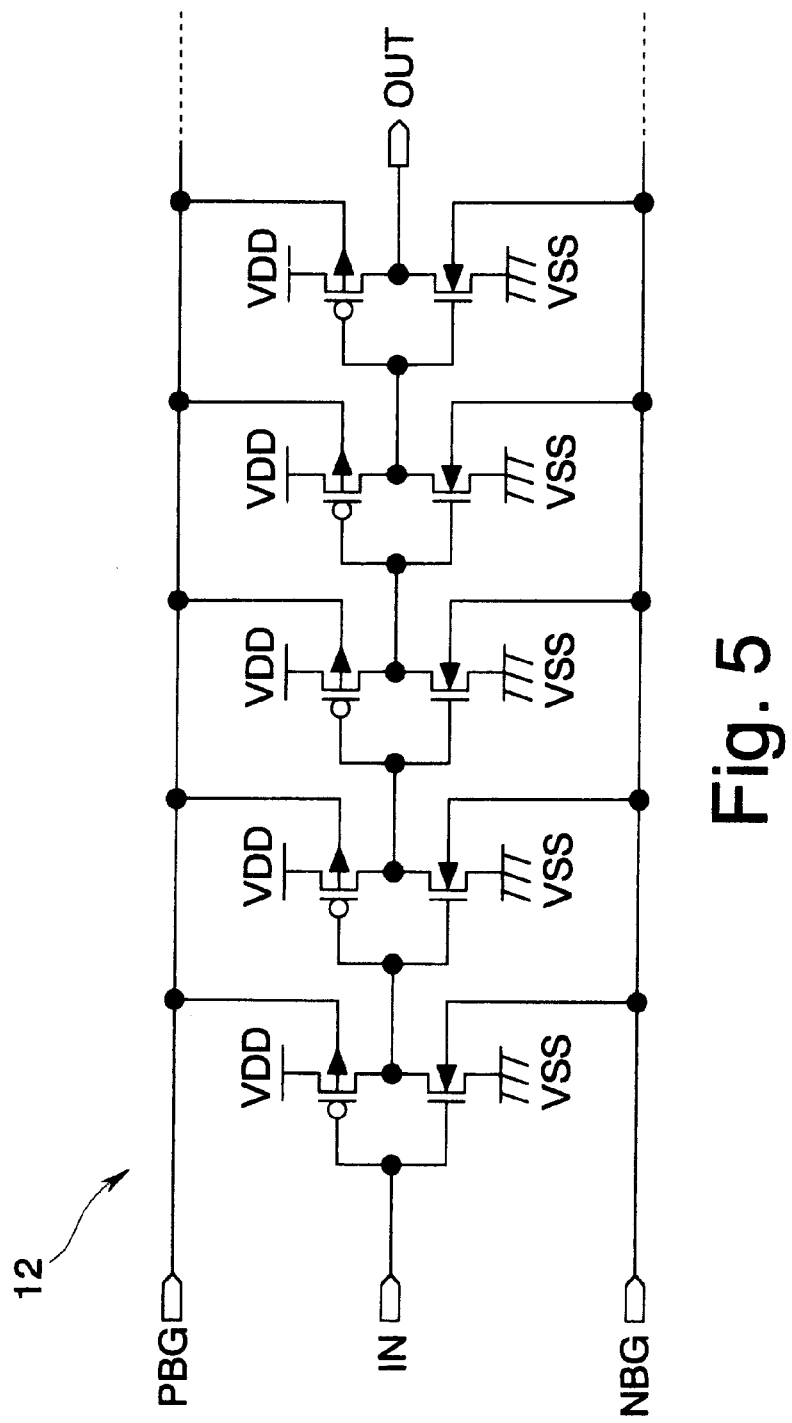
FIG. 5 is a circuit diagram showing an inverter row in the first embodiment.

FIG. 5 shows an example of an inverter row 12 including a plurality of cascaded CMOS inverters, wherein the substrates of the pMOSs and nMOSs are connected to the nodes PBG and NBG, respectively. In this example, the operating speed of the inverter row 12 improves during operation periods in particular.

Figure 6:
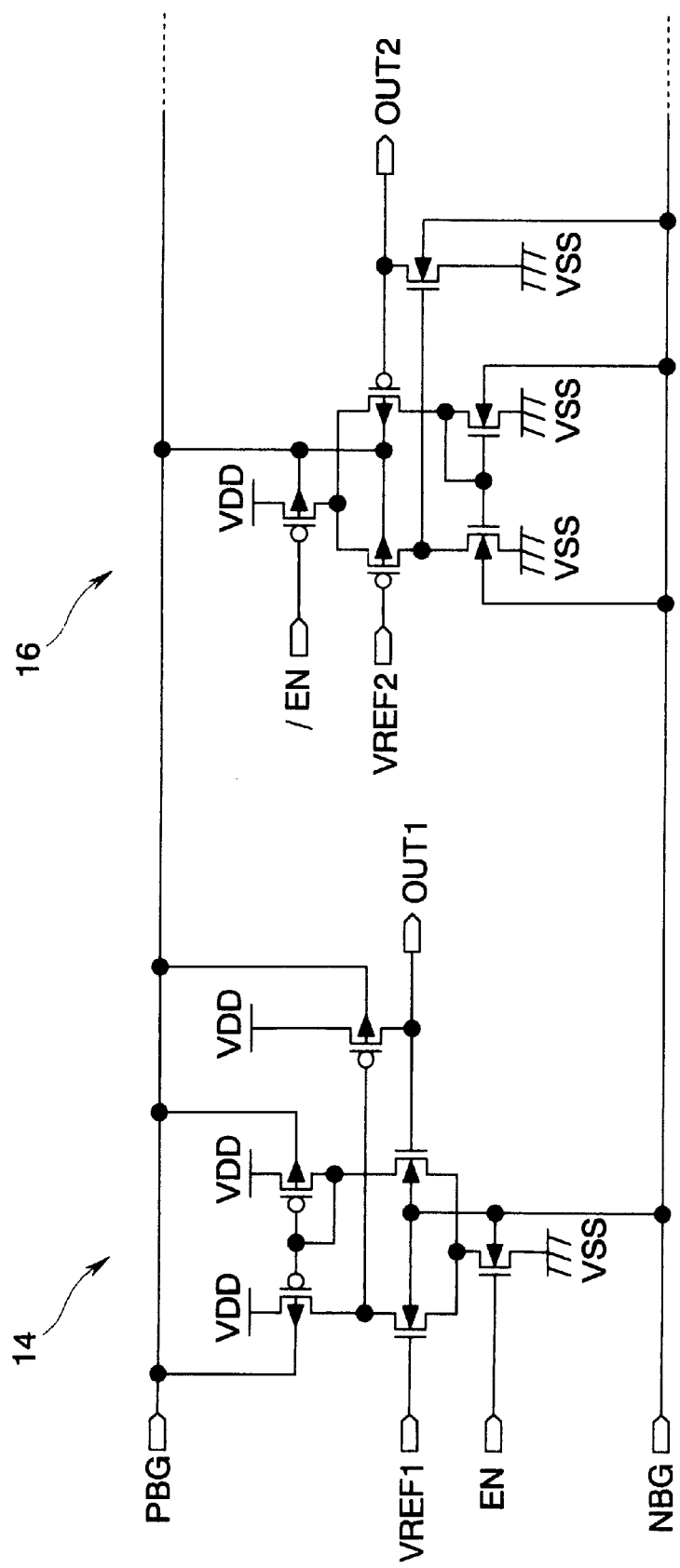
FIG. 6 is a circuit diagram showing differential amplifiers in the first embodiment.

FIG. 6 shows an example of differential amplifiers 14 and 16 of current mirror type, which are constructed by CMOSs, wherein the substrates of the pMOSs and nMOSs are connected to the nodes PBG and NBG, respectively. In this example, during the operation periods of the differential amplifiers 14 and 16 enable signals EN and /EN are turned to high level and low level, respectively. During the non-operation periods of the differential amplifiers 14 and 16, the enable signals EN and /EN are turned to low level and high level, respectively. Then, the nodes PBG and NBG are changed to improve the operating speed of the differential amplifiers 14 and 16 during their operation periods, and to reduce the leak currents of the differential amplifiers 14 and 16 during their non-operation periods.

In this way, the substrates of the transistors in such analog circuits as the differential amplifiers 14 and 16 can be connected to the node PBG (or NBG) with particularly significant effects. Among other analog circuits formed on the DRAM are sense amplifiers for amplifying data read from memory cells, and a starter circuit which operates upon the startup of the power supply. Note that the pMOSs and nMOSs to be connected to the nodes PBG and NBG at their substrates are not limited to those in the examples of FIGS. 5 and 6. For example, the substrates of all the pMOSs and nMOSs on the DRAM may be connected to the nodes PBG and NBG, respectively. The substrates of the pMOSs and nMOSs in some of the internal circuits of the DRAM may be connected to the nodes PBG and NBG, respectively.

As has been described, according to the semiconductor integrated circuit of the present embodiment, the substrate voltages of the pMOS and nMOS are changed to a voltage between the internal power supply voltage VDD and the ground voltage VSS during the operation periods of the internal circuits, so as to lower the threshold voltages of the pMOS and nMOS. Therefore, the pMOS and nMOS can be improved in drivability and operating speed. This consequently allows high speed operation of the internal circuits. The absence of the particular need for the boosters, pumping circuits, or the like for generating substrate voltages allows a reduction in layout area.

During the non-operation periods of the internal circuits, the substrate voltages of the pMOS and nMOS are turned to the internal power supply voltage VDD and the ground voltage VSS, respectively, to make their threshold voltages higher than in operation periods. Accordingly, the leak currents of the transistors during the non-operation periods can be reduced to lower the consumption current of the semiconductor integrated circuit in the standby periods.

During the operation periods of the internal circuits, the substrate of the pMOS and the substrate of the nMOS are connected to each other. This mutual short of the substrates of the pMOS transistor and the nMOS transistor facilitates setting the substrate voltages to a value between the internal power supply voltage VDD and the ground voltage VSS.

During the non-operation periods of the internal circuits, the pMOS and nMOS have lower forward biases (0.5 V) between the respective sources and substrates than the built-in potential (approximately 0.6 V) of the pn junctions between the sources and substrates. This can prevent the production of forward currents.(leak currents) on the pn junctions even when the pMOS and nMOS are biased forward between their respective sources and substrates. Thus, the threshold voltages of these transistors can be maintained at a predetermined value, thereby preventing the transistors from fluctuating in drivability.

During the operation periods of the internal circuits, the substrate voltage of the pMOS and the substrate voltage of the nMOS are set at the value (0.5 V) at the center of the internal power supply voltage VDD and the ground voltage VSS. This can provide equal differences (margins) of 0.1 V between the built-in potentials (0.6 V), and the source-to-substrate voltages (0.5 V) of the pMOS and nMOS.

During the operation periods of the internal circuits, the substrates of the pMOS and the nMOS, charged by applying different voltages, are connected to each other. Therefore, the substrate voltages of these transistors can be easily set at desired values in accordance with the substrate capacitor of the pMOS and the substrate capacitor of the nMOS.

The present invention can offer significant effects particularly when applied to semiconductor integrated circuits having operation voltages equal to or lower than 1 V.

Figure 7:
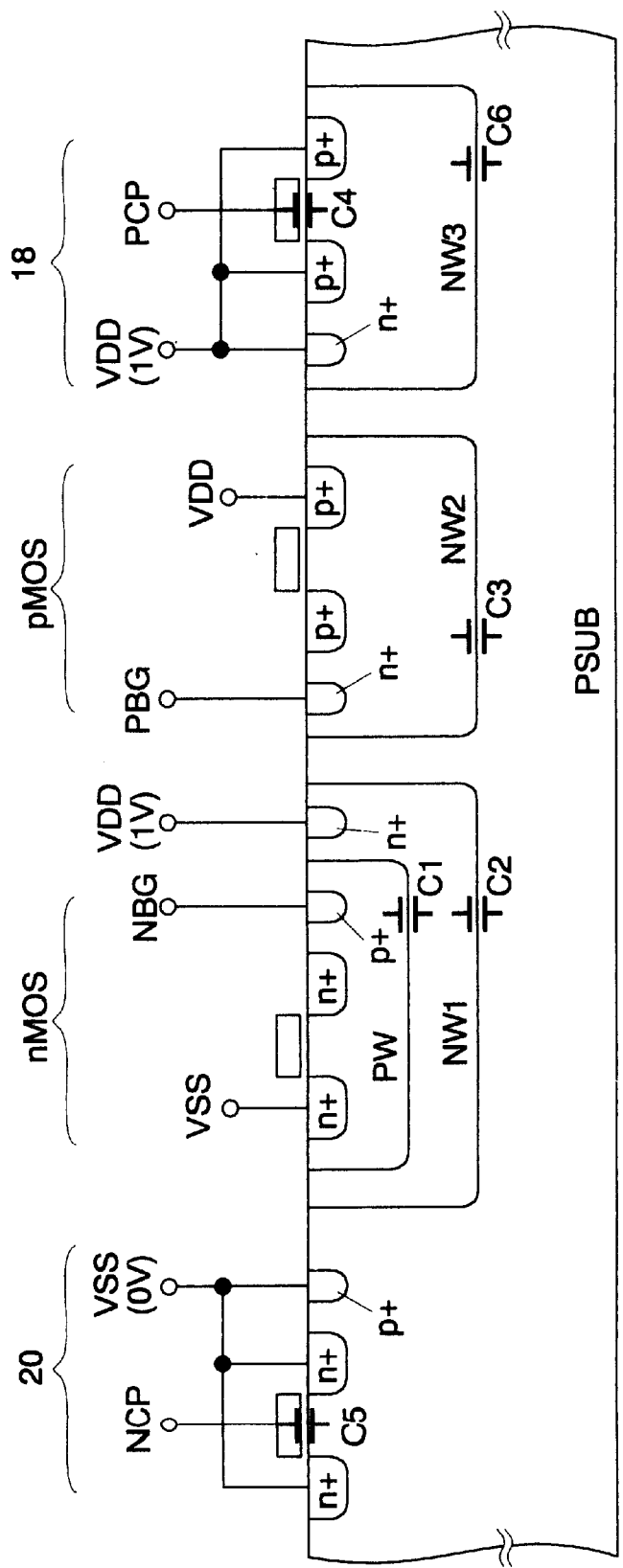
FIG. 7 is a sectional view of a substrate according to a second embodiment of the semiconductor integrated circuit in the present invention.
Figure 8:
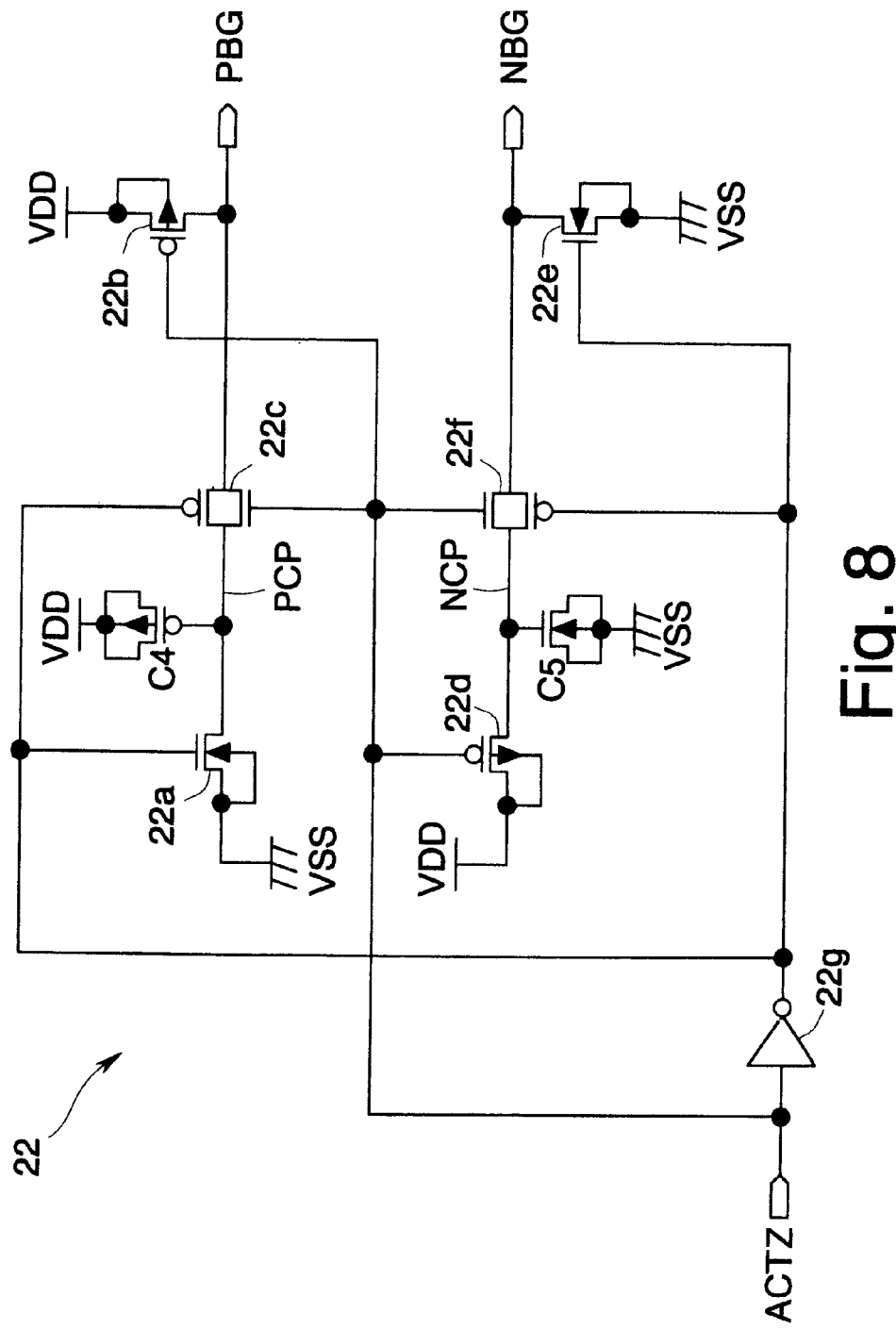
FIG. 8 is a circuit diagram showing a switching circuit in the second embodiment.
Figure 9:
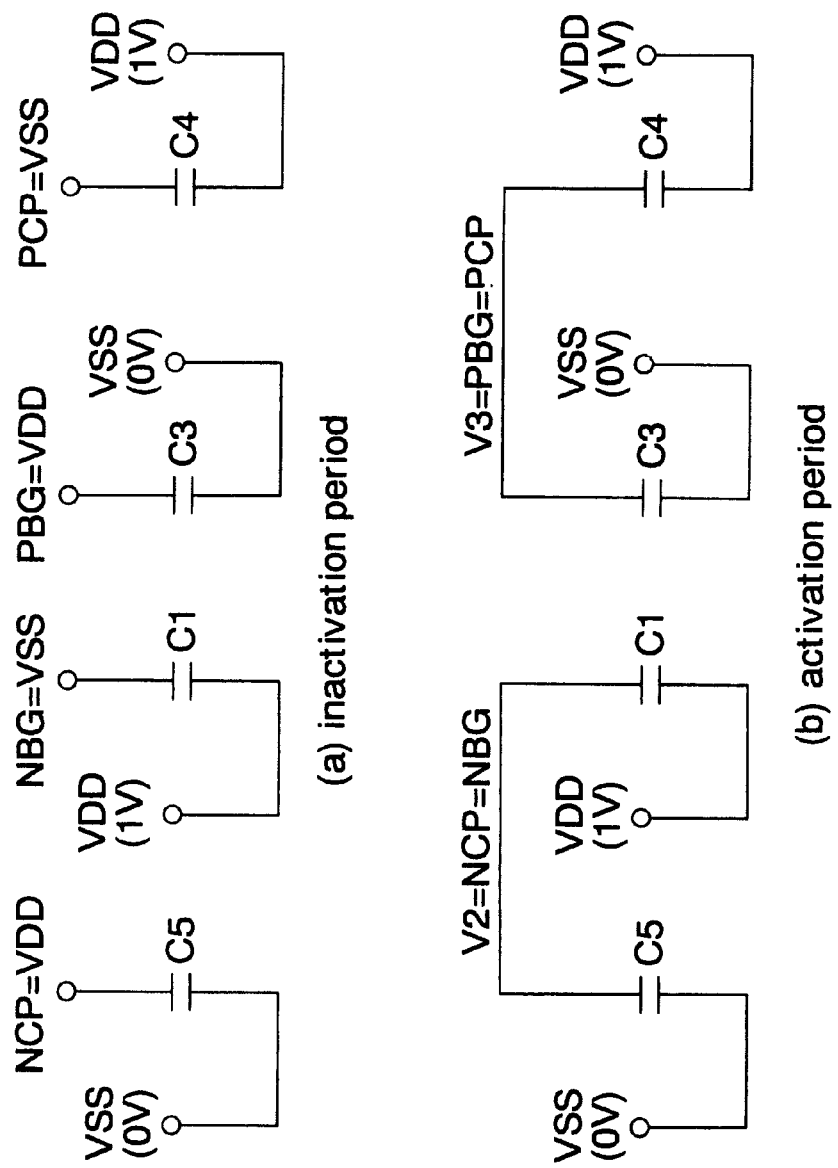
FIGS. 9(a) and 9(b) are equivalent circuit diagrams pertaining to the capacitors in FIG. 7.

FIGS. 7 through 9 show a second embodiment of the semiconductor integrated circuit in the present invention. The same circuits and signals as those described in the first embodiment will be designated by identical reference numbers. Detailed description thereof will be omitted here. The semiconductor integrated circuit is formed, for example, as a logic LSI on a p-type silicon substrate by using CMOS processes.

FIG. 7 shows a part of the sectional structure of this logic LSI.

N-type impurities are implanted into a p-type substrate PSUB to form n wells NW1, NW2, and NW3. P-type impurities are implanted into the n well NW1 to form a substrate region of an nMOS transistor, or a p well PW. The nMOS and the pMOS have the same structures as those in the first embodiment.

The substrate PSUB is connected to a ground line VSS (0 V) through a diffusion region (p+ layer) into which p-type impurities are implanted. The substrate of the nMOS, or the p well PW, is connected to a node NBG through a p-type diffusion region (p+ layer). The substrate of the pMOS, or the n well NW2, is connected to a node PBG through an n-type diffusion region (n+ layer).

A pMOS 18 is formed in the n well NW3. The source, drain, and substrate of the pMOS 18 are connected to an internal power supply line VDD (1 V). The gate of the pMOS 18 is connected to a node PCP. Then, an MOS capacitor C4 is formed by using the gate oxide of the pMOS 18. An nMOS 20 is formed in the p-type substrate PSUB. The source, drain, and substrate of the nMOS 20 are connected to the ground line VSS (0 V). The gate of the nMOS 20 is connected to a node NCP. Then, an MOS capacitor C5 is formed by using the gate oxide of the nMOS 20.

In this embodiment, the MOS capacitor C5 and the junction capacitor C1 are equal in value. The MOS capacitor C4 and the junction capacitor C3 are equal in value.

FIG. 8 shows a switching circuit 22 for generating the voltages on the nodes NBG, PBG and the nodes NCP, PCP.

The switching circuit 22 includes the MOS capacitors C4 and C5 shown in FIG. 7, an nMOS 22a connected to the node PCP at its drain, a pMOS 22b connected to the node PBG at its drain, a CMOS transmission gate 22c for establishing connection between the node PCP and the node PBG, a pMOS 22d connected to the node NCP at its drain, an nMOS 22e connected to the node NBG at its drain, a CMOS transmission gate 22f for establishing connection between the node NCP and the node NBG, and an inverter 22g.

The gates of the pMOSs 22b, 22d and the gates of the nMOSs in the CMOS transmission gates 22c, 22f receive an activating signal ACTZ. The gates of the nMOSs 22a, 22e and the gates of the pMOSs in the CMOS transmission gates 22c, 22f receive the inverted signal of the activating signal ACTZ through the inverter 22g. The sources of the pMOSs 22b and 22d are connected to the internal power supply voltage VDD. The sources of the nMOSs 22a and 22e are connected to the ground line VSS.

In this switching circuit 22, the nMOSs 22a, 22e and the pMOSs 22b, 22d are turned on and the CMOS transmission gates 22c, 22f are turned off during an inactivation period where internal circuits stop operating (the activating signal ACTZ=low level). Here, the nodes PBG and NBG have the internal power supply voltage VDD and the ground voltage VSS, respectively, as in the first embodiment. The node PCP falls to the ground voltage, which charges the MOS capacitor C4. The node NCP reaches the internal power supply voltage VDD, which charges the MOS capacitor C5.

Then, during an activation period where internal circuits operate (the activating signal ACTZ=high level), the nMOSs 22a, 22e and the pMOSs 22b, 22d are turned off and the CMOS transmission gates 22c, 22f are turned on. Here, the nodes PBG and PCP are connected to each other, and the nodes NBG and NCP are connected to each other. Due to the connection of the nodes PBG and PCP, the charge stored in the junction capacitor C3 (FIG. 7) connected to the node PBG and the charge stored in the MOS capacitor C4 are distributed. Similarly, due to the connection of the nodes NBG and NCP, the charge stored in the junction capacitor C1 (FIG. 7) connected to the node NBG and the charge stored in the MOS capacitor C5 are distributed.

FIGS. 9(a) and 9(b) show equivalent circuits pertaining to the junction capacitors C1, C3 shown in FIG. 7 and the MOS capacitors C4, CS.

As shown in FIG. 9(a), during the inactivation period, the junction capacitors C1, C3 and the MOS capacitors C4, C5 each are supplied across with the ground voltage VSS and the internal power supply voltage VDD.

As shown in FIG. 9(b), during the activation period, the node NBG and the node NCP, as well as the node PBG and the node PCP, are connected to each other. Accordingly, the charges stored in the capacitors C1 and C5 are shared in accordance with the ratio between the capacitors C1 and CS. Similarly, the charges stored in the capacitors C3 and C4 are shared in accordance with the ratio between the capacitors C3 and C4. This provides the nodes NBG and NCP with the same voltage V2, and the nodes PBG and PCP with the same voltage V3. The voltage V2 of the nodes NBG, NCP and the voltage V3 of the nodes PBG, PCP are given by the following equations (2) and (3), respectively:

$$V2=(VSS \cdot C1+VDD \cdot C5)/(C1+C5) \quad (2)$$

$$V3=(VDD \cdot C3+VSS \cdot C4)/(C3+C4) \quad (3)$$

In this embodiment, the capacitors C3 and C4 are made equal to each other, and the capacitors C1 and C5 are made equal to each other. Thus, from the equations (2) and (3), both the voltage V2 of the nodes NBG, NCP and the voltage V3 of the nodes PBG, PCP fall on the value at the center of the internal power supply voltage VDD and the ground voltage VSS, or 0.5 V. That is, the pn junctions across the respective sources and substrates of the pMOS and nMOS undergo 0.5 V forward, as in the first embodiment. As a result, the pMOS and the nMOS improve in operating speed during the activation period. During the inactivation period, the leak currents from the pMOS and nMOS are reduced to lower the power consumption.

This embodiment can offer the same effects as those obtained from the first embodiment described above. Moreover, in this embodiment, the MOS capacitors C4 and C5 which are charged by applying predetermined voltages are connected to the substrates of the pMOS and nMOS, respectively, to generate the substrate voltages of the pMOS and nMOS during the activation period of the internal circuits. Therefore, depending on the ratios between the junction capacitors C1, C3 of the pMOS, nMOS substrates and the MOS capacitors C4, C5, the substrate voltages can be easily set at desired values.

Figure 10:
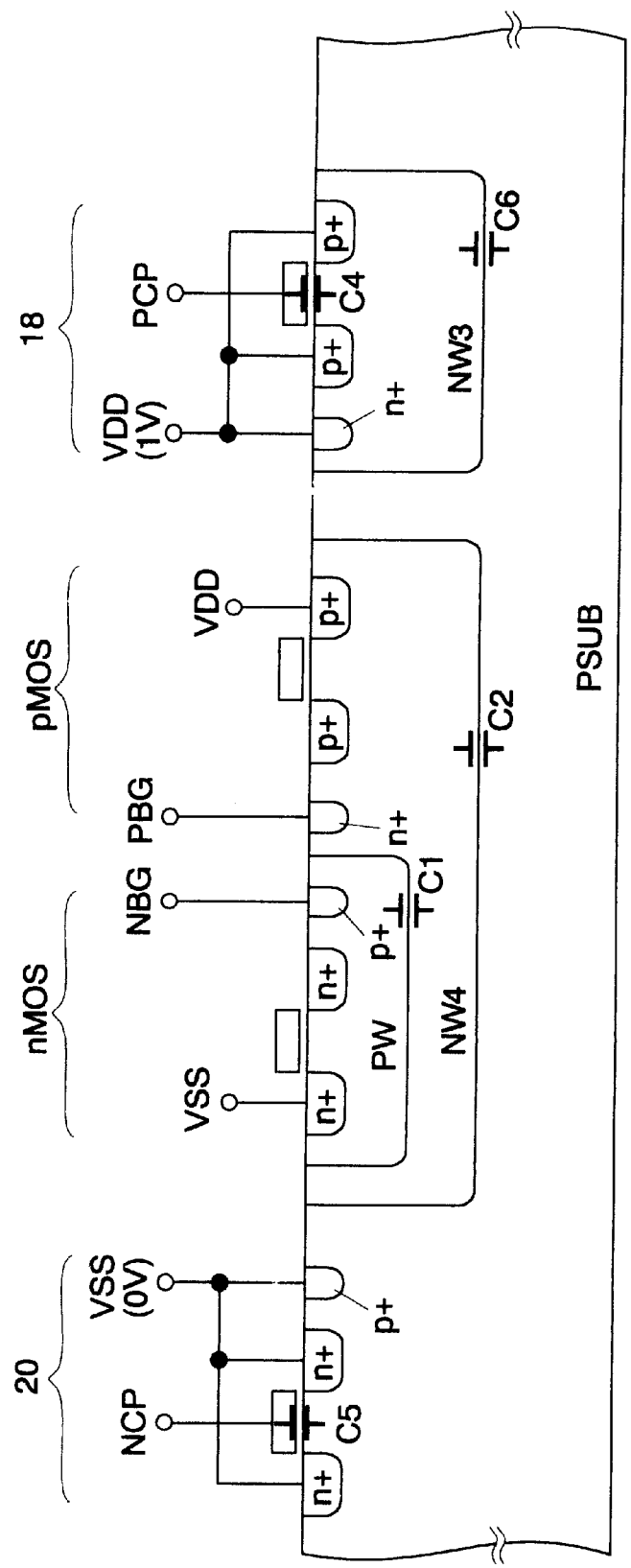
FIG. 10 is a sectional view of a substrate according to a third embodiment of the semiconductor integrated circuit in the present invention.
Figure 11:
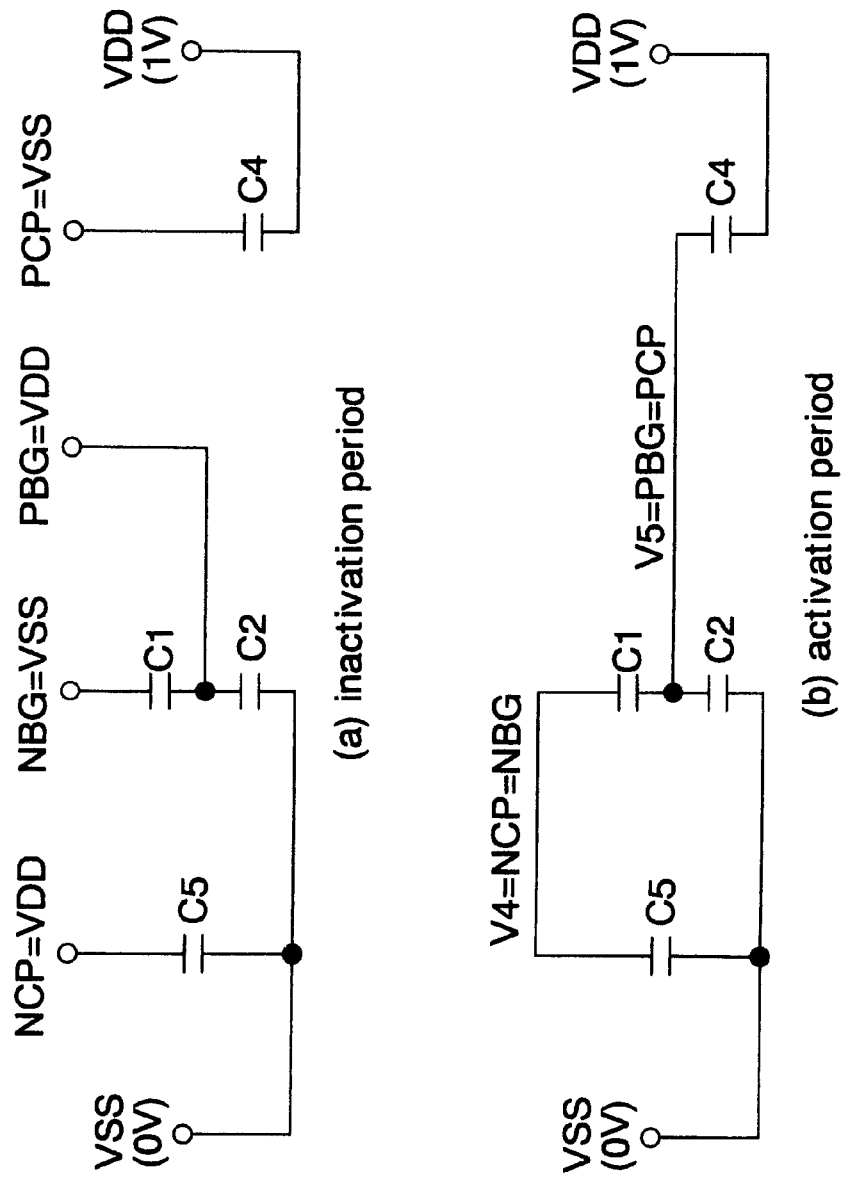
FIGS. 11(a) and 11(b) are equivalent circuit diagrams pertaining to the capacitors in FIG. 10.

FIGS. 10 and 11 show a third embodiment of the semiconductor integrated circuit in the present invention. The same circuits and signals as those described in the first and second embodiments will be designated by identical reference numbers. Detailed description thereof will be omitted here. The semiconductor integrated circuit is formed on a p-type silicon substrate by using CMOS processes.

FIG. 10 shows a part of the sectional structure of this integrated circuit.

In this embodiment, the n well NW1 and the substrate of the pMOS, or the n well NW2, shown in FIG. 7 are integrated into a single n well NW4. The n well NW4 is connected to a node PBG through an n-type diffusion region (n+ layer). The other structures are identical to those in the second embodiment described above.

FIGS. 11(a) and 11(b) show equivalent circuits pertaining to the junction capacitors C1, C2 and the MOS capacitors C4, C5 shown in FIG. 10.

As shown in FIG. 11(a), during an inactivation period where internal circuits stop operating, both ends of the junction capacitors C1, C2 and those of the MOS capacitors C4, C5 are respectively supplied with the ground voltage VSS and the internal power supply voltage VDD.

As shown in FIG. 11(b), during an activation period where the internal circuits operate, the node NBG and the node NCP, as well as the node PBG and the node PCP, are connected to each other. Here, the voltages V4 and V5 of the node NBG (=NCP) and the node PBG (=PCP) are given by the equations (4) and (5), respectively:

$$V4=[1/(C1+C5)] \cdot [C1 \; VSS+C5 \cdot VDD+C1 \; C4 \cdot (VDD-VSS)/(C2+C4)] \quad (4)$$

$$V5=(C2 \cdot VDD+C4 \cdot VSS)/(C2+C4) \quad (5)$$

From the equations (4) and (5), the condition for V4 and V5 to coincide with each other is expressed by the equation (6):

$$C4 \cdot (C1-C5)-C1 \cdot C2=0 \quad (6)$$

From the equation (6), V4 and V5 coincide with each other when, for example, C5=(1/2)·C1 and C4=2·C2.

This embodiment can offer the same effects as those obtained from the second embodiment described above.

Figure 12:
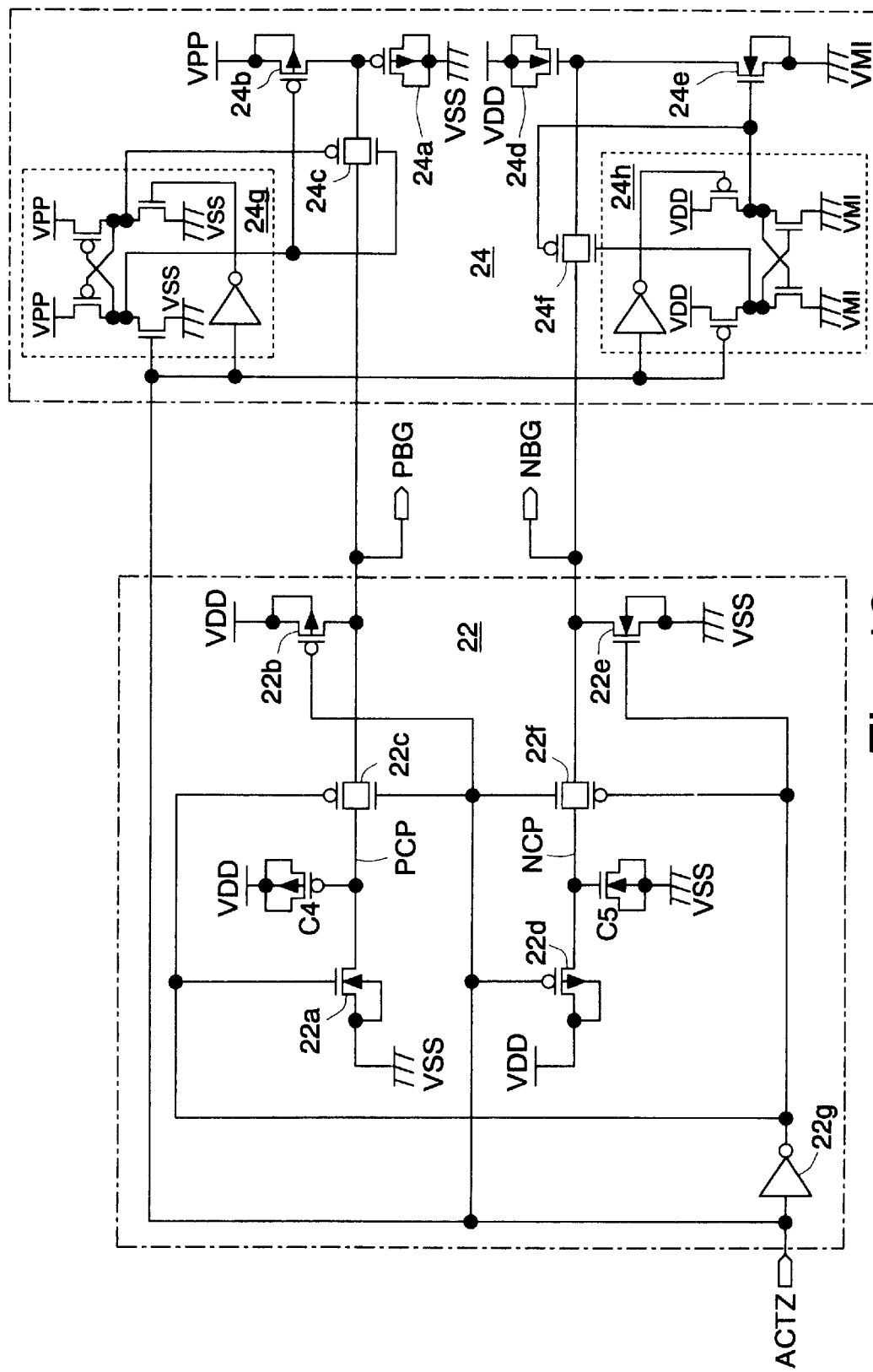
FIG. 12 is a circuit diagram showing switching circuits according to a fourth embodiment of the semiconductor integrated circuit in the present invention.

FIG. 12 shows a fourth embodiment of the semiconductor integrated circuit in the present invention. The same circuits and signals as those described in the first embodiment will be designated by identical reference numbers. Detailed description thereof will be omitted here. The semiconductor integrated circuit is formed on a p-type silicon substrate by using CMOS processes.

In this embodiment, a switching circuit 22 identical to that of the second embodiment and a switching circuit 24 are connected to the nodes PBG and NBG.

The switching circuit 24 includes: a MOS capacitor 24a consisting of a PMOS, having a source, a drain, and a substrate connected to a ground line VSS; a pMOS 24b for charging the MOS capacitor 24a; a CMOS transmission gate 24c for connecting the MOS capacitor 24a to the node PBG; an MOS capacitor 24d consisting of an nMOS, having a source, a drain, and a substrate connected to an internal power supply line VDD; an nMOS 24e for charging the MOS capacitor 24d; a CMOS transmission gate 24f for connecting the MOS capacitor 24d to the node NBG; and level shifters 24g and 24h.

The source and substrate of the pMOS 24b are connected to a boosted power supply line VPP. The voltage (VPP) of the power supply line VPP is used, for example, as the high level on word lines (not shown) that control the transfer switches in memory cells. The source and substrate of the nMOS 24e are connected to a power supply line VMI to which a negative voltage is supplied. The voltage (VMI) of the power supply line is used as the low level on the word lines (resetting voltage) or the substrate voltages of the memory cells.

The sources of the pMOSs in the level shifter 24g are connected to the power supply line VPP. The level shifter 24g outputs a signal that carries the same logic as that of the activating signal ACTZ, to the gate of the pMOS in the CMOS transmission gate 24c. The level shifter 24g outputs a signal that carries the inverted logic of the activating signal ACTZ, to the gate of the pMOS 24b and the gate of the nMOS in the CMOS transmission gate 24c. The pMOS 24b and the CMOS transmission gate 24c are securely turned off by receiving the voltage VPP as their high level.

The sources of the nMOSs in the level shifter 24h are connected to the power supply line VMI. The level shifter 24h outputs a signal that carries the same logic as that of the activating signal ACTZ, to the gate of the nMOS 24e and the gate of the pMOS in the CMOS transmission gate 24f. The level shifter 24g outputs a signal that carries the inverted logic of the activating signal ACTZ, to the gate of the nMOS in the CMOS transmission gate 24f. The nMOS 24e and the CMOS transmission gate 24f are securely turned off by receiving the voltage VMI as their low level.

During an activation period where internal circuits operate (the activating signal ACTZ=high level), the switching circuit 24 turns the pMOS 24b and the nMOS 24e on, and turns the CMOS transmission gates 24c and 24f off. The MOS capacitors 24a and 24d are charged in accordance with the voltages VPP and VMI, respectively. Here, as in the second embodiment described above, the switching circuit 22 connects the nodes PCP and PBG to each other as well as the nodes NCP and NBG. The nodes PBG and NBG both have 0.5 V.

On the other hand, during an inactivation period where the internal circuits stop operating (the activating signal ACTZ= low level), the switching circuit 24 turns the pMOS 24b and the nMOS 24e off, and turns the CMOS transmission gates 24c and 24f on. The charges stored in the MOS capacitors 24a and 24d are supplied to the nodes PBG and NBG through the CMOS transmission gates 24c and 24f, respectively. Accordingly, the voltage VPP higher than the internal power supply voltage VDD (1 V) is temporarily applied to the node PBG. Similarly, the voltage VMI lower than the ground voltage VSS (0 V) is temporarily applied to the node NBG. As a result, at the time of transition from the activation period to the inactivation period, the substrate voltages of the pMOS and nMOS shift swiftly to the internal power supply voltage VDD and the ground voltage VSS, respectively.

This embodiment can offer the same effects as those obtained from the first and second embodiments described above. Moreover, in this embodiment, the charges that are stored in the MOS capacitors 24a and 24d during the activation period of the internal circuits can be utilized to shift the substrate voltages of the pMOS and nMOS swiftly to the internal power supply voltage VDD and the ground voltage VSS, respectively, at the time of transition from the activation period to the inactivation period.

Figure 13:
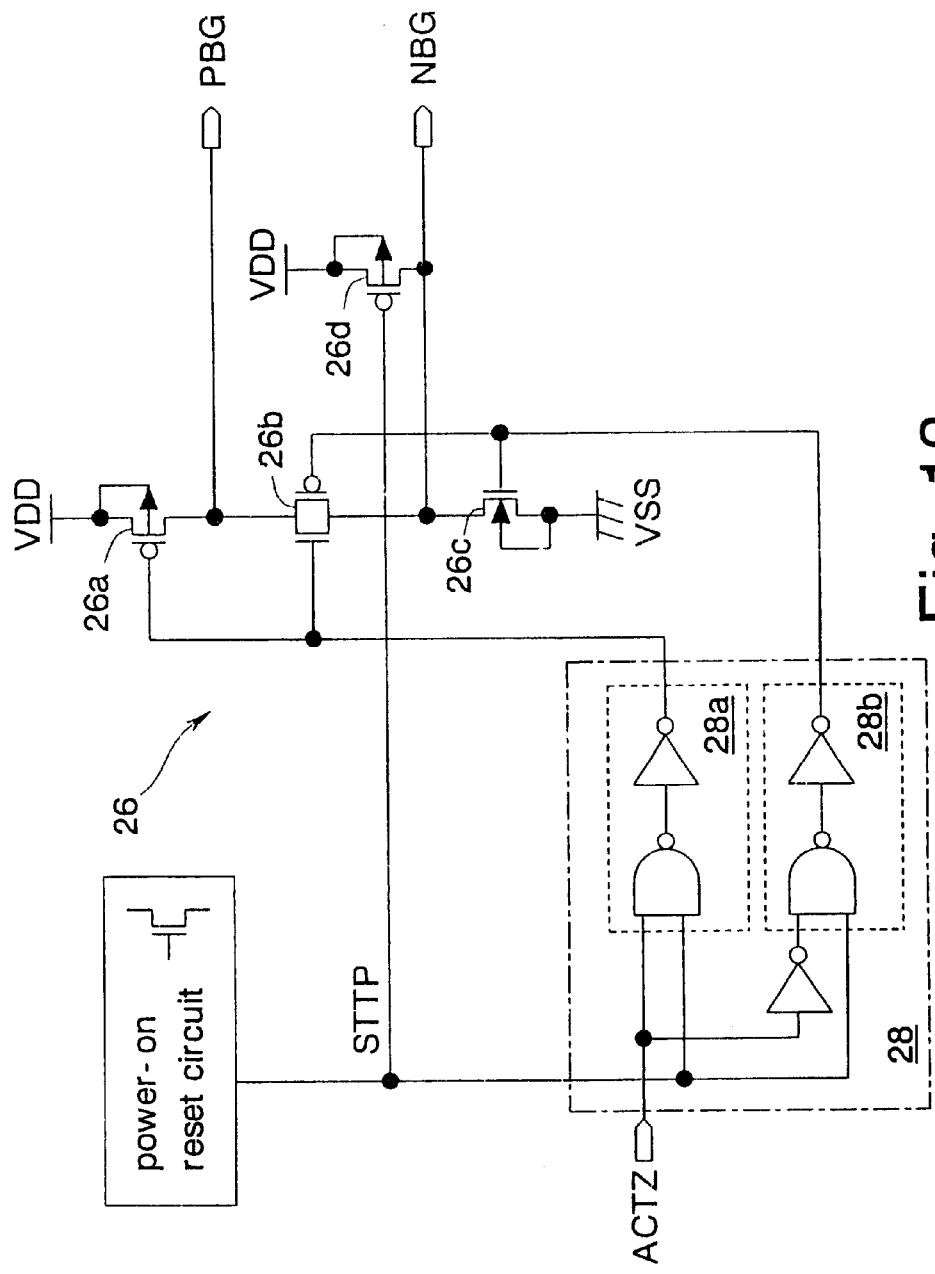
FIG. 13 is a circuit diagram showing a switching circuit according to a fifth embodiment of the semiconductor integrated circuit in the present invention.
Figure 14:
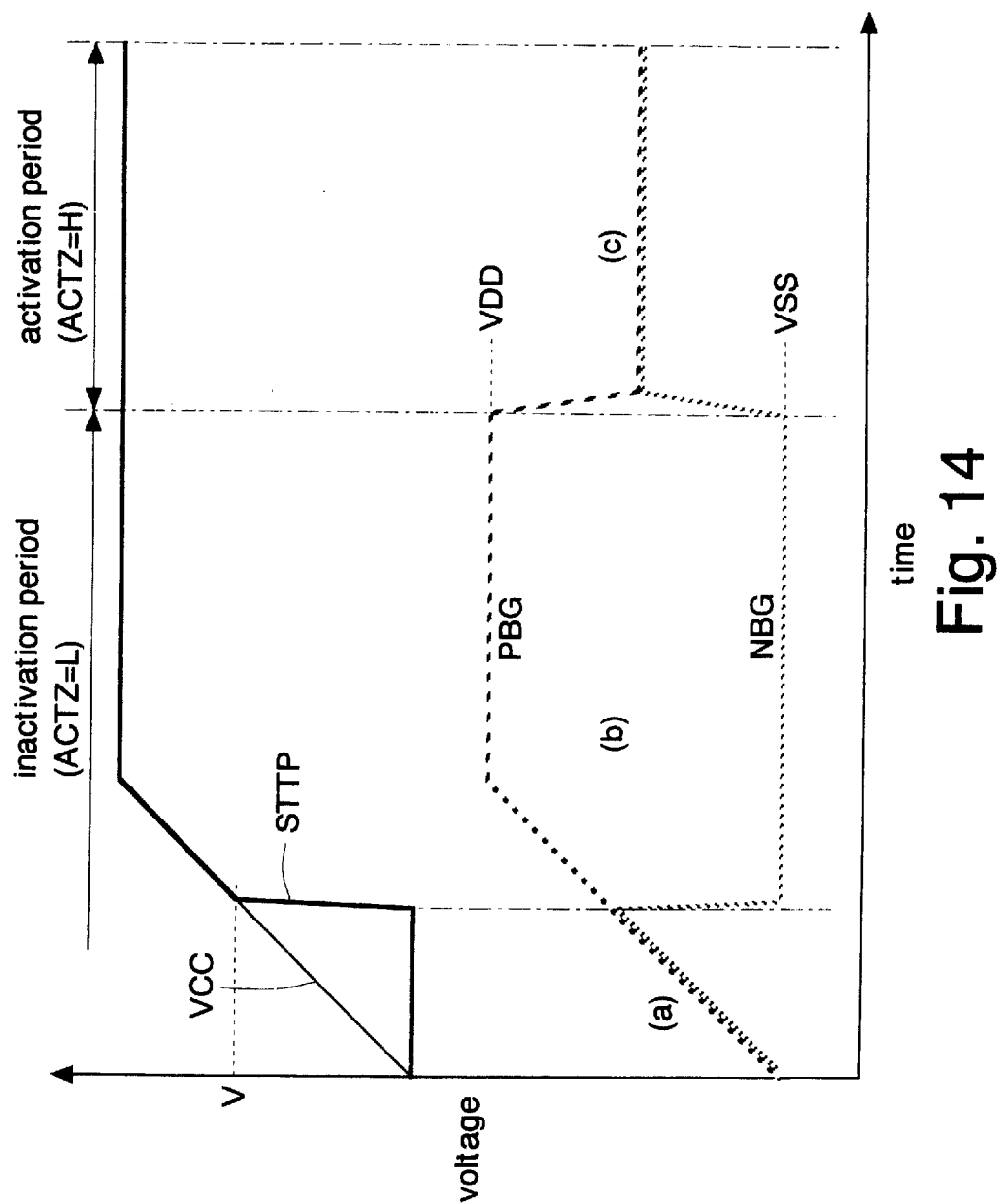
FIG. 14 is a timing chart showing variations of the nodes PBG and NBG upon the turning-on of a power supply.

FIGS. 13 and 14 show a fifth embodiment of the semiconductor integrated circuit in the present invention. The same circuits and signals as those described in the first embodiment will be designated by identical reference numbers. Detailed description thereof will be omitted here. The semiconductor integrated circuit is formed on a p-type silicon substrate by using CMOS processes. This integrated circuit is supplied with, for example, a power supply voltage VCC of 1 V from exterior.

FIG. 13 shows a switching circuit 26. The configurations excepting the switching circuit 26 are identical to those of the first embodiment described above.

The switching circuit 26 includes a pMOS 26a, a CMOS transmission gate 26b, and an nMOS 26c which are connected in series between an internal power supply line VDD and a ground line VSS. The switching circuit 26 also includes a pMOS 26d and a control circuit 28. The substrate of the pMOS 26a is connected to the internal power supply line VDD. The substrate of the nMOS 26c is connected to the ground line VSS. The source and substrate of the pMOS 26d are connected to the internal power supply line VDD. The node PBG is connected to the drain of the pMOS 26a, and the node NBG is connected to the drains of the nMOS 26c and the pMOS 26d. The gate of the pMOS 26d receives a power-on resetting signal STTP. The power-on resetting signal STTP is generated by a not-shown power-on resetting circuit when the power supply is supplied to this DRAM.

The control circuit 28 includes an AND circuit 28a which receives the activating signal ACTZ and the power-on resetting signal STTP, and an AND circuit 28b which receives the inverted signal of the activating signal ACTZ and the power-on resetting signal STTP. The AND circuit 28a outputs low level when the power-on resetting signal STTP is at low level. The AND circuit 28a outputs the same logical level as that of the activating signal ACTZ when the power-on resetting signal STTP is at high level. The AND circuit 28b outputs low level when the power-on resetting signal STTP is at low level. The AND circuit 28b outputs the inverted logical level of the activating signal ACTZ when the power-on resetting signal STTP is at high level. The output of the AND circuit 28a is connected to the gate of the pMOS 26a and the gate of the nMOS in the CMOS transmission gate 26b. The output of the AND circuit 28b is connected to the gate of the nMOS 26c and the gate of the pMOS in the CMOS transmission gate 26b.

FIG. 14 shows variations of the power-on resetting signal STTP and the nodes PBG, NBG when the power supply is supplied to the DRAM.

After the power supply voltage VCC starts to be supplied from exterior, the power-on resetting signal STUP is kept at low level until the voltage VCC reaches a predetermined voltage V. Then, the power-on resetting signal STTP turns to high level. In the low-level period of the power-on resetting signal STTP, predetermined circuits of the DRAM are initialized. During the period where the power-on resetting signal STTP is at low level, the pMOSs 26a and 26d shown in FIG. 13 are turned on so that both the nodes PBG and NBG are connected to the internal power supply line VDD (FIG. 14(a)). Since the internal power supply voltage VDD is supplied to the node NBG, those nMOSs having their substrates connected to the node NBG become lower in threshold voltage than when their substrates are connected to the ground line VSS.

Accordingly, in such cases that the power-on resetting circuit (not shown) uses the nMOS threshold voltage to generate the power-on resetting signal STTP, the power-on resetting signal STUP can be securely inactivated when the power supply voltage VCC, even if low, reaches the predetermined voltage V. In other words, the power-on resetting signal STTP can be generated at optimum timing even when the power supply voltage VCC is low.

Subsequently, the DRAM enters a standby state (inactivation period), and the activating signal ACTZ is turned to low level in accordance with input signals. Here, the power-on resetting signal STUP changes to high level, so that the pMOS 26d and the nMOS 26c are turned off and on, respectively. The pMOS 26a maintains its ON state. The nodes PBG and NBG, as in the first embodiment, are connected to the internal power supply line VDD and the ground line VSS, respectively (FIG. 14(b)).

Next, the DRAM enters an operation state (activation period) and the activating signal ACTZ is turned to high level. The high level of the power-on resetting signal STTP and the high level of the activating signal ACTZ turn the pMOSs 26a, 26d and the nMOS 26c off, and turn the CMOS transmission gate 26b on. The nodes PBG and NBG, as in the first embodiment, are connected to each other so that their voltages fall on a voltage between the internal power supply voltage VDD and the ground voltage VSS (FIG. 14(c)).

This embodiment can offer the same effects as those obtained from the first embodiment described above. Moreover, in this embodiment, the nMOS threshold voltages can be lowered upon the startup of the power supply. Therefore, the power-on resetting signal can be generated with reliability even when the power supply voltage VCC is low.

Figure 15:
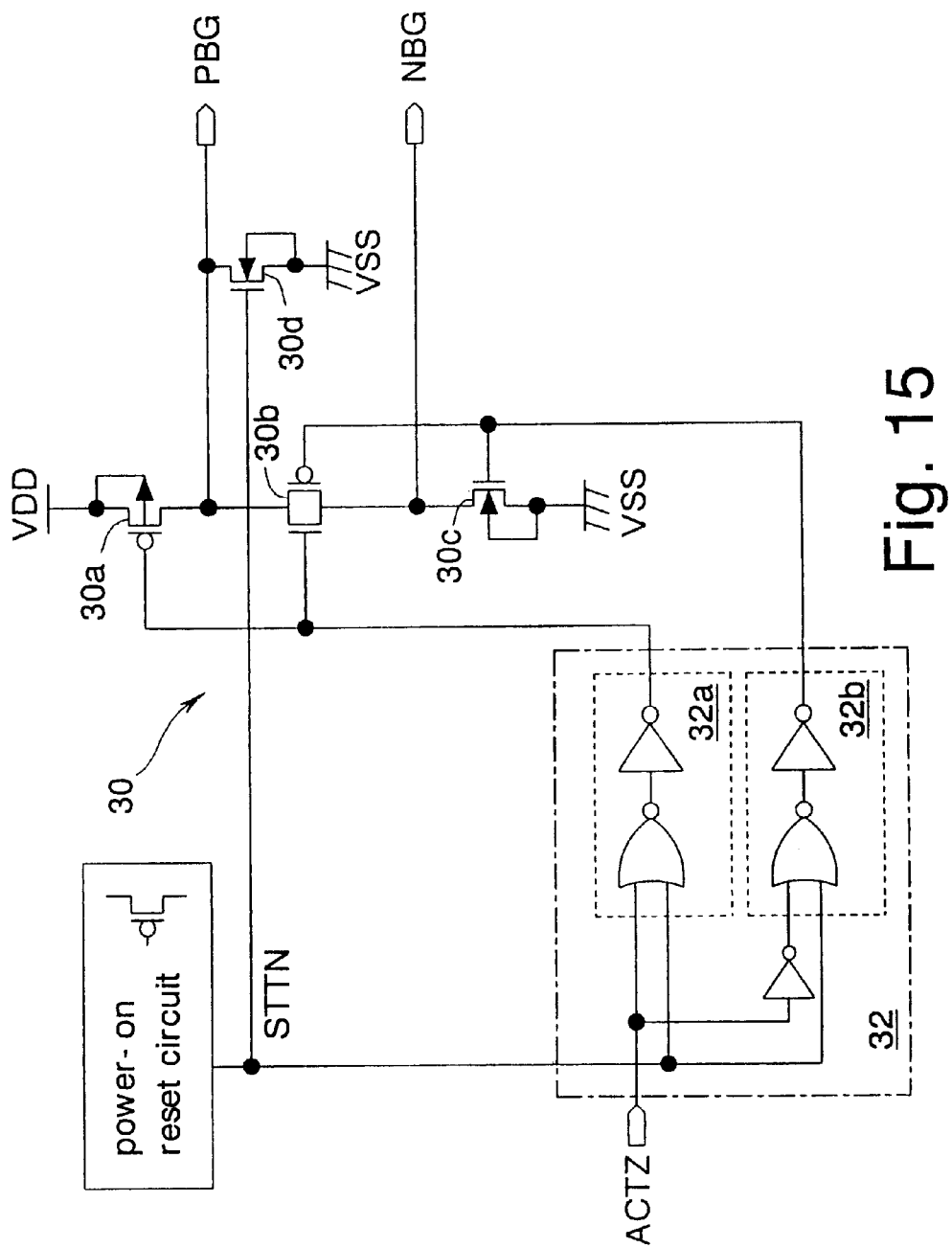
FIG. 15 is a circuit diagram showing a switching circuit according to a sixth embodiment of the semiconductor integrated circuit in the present invention.
Figure 16:
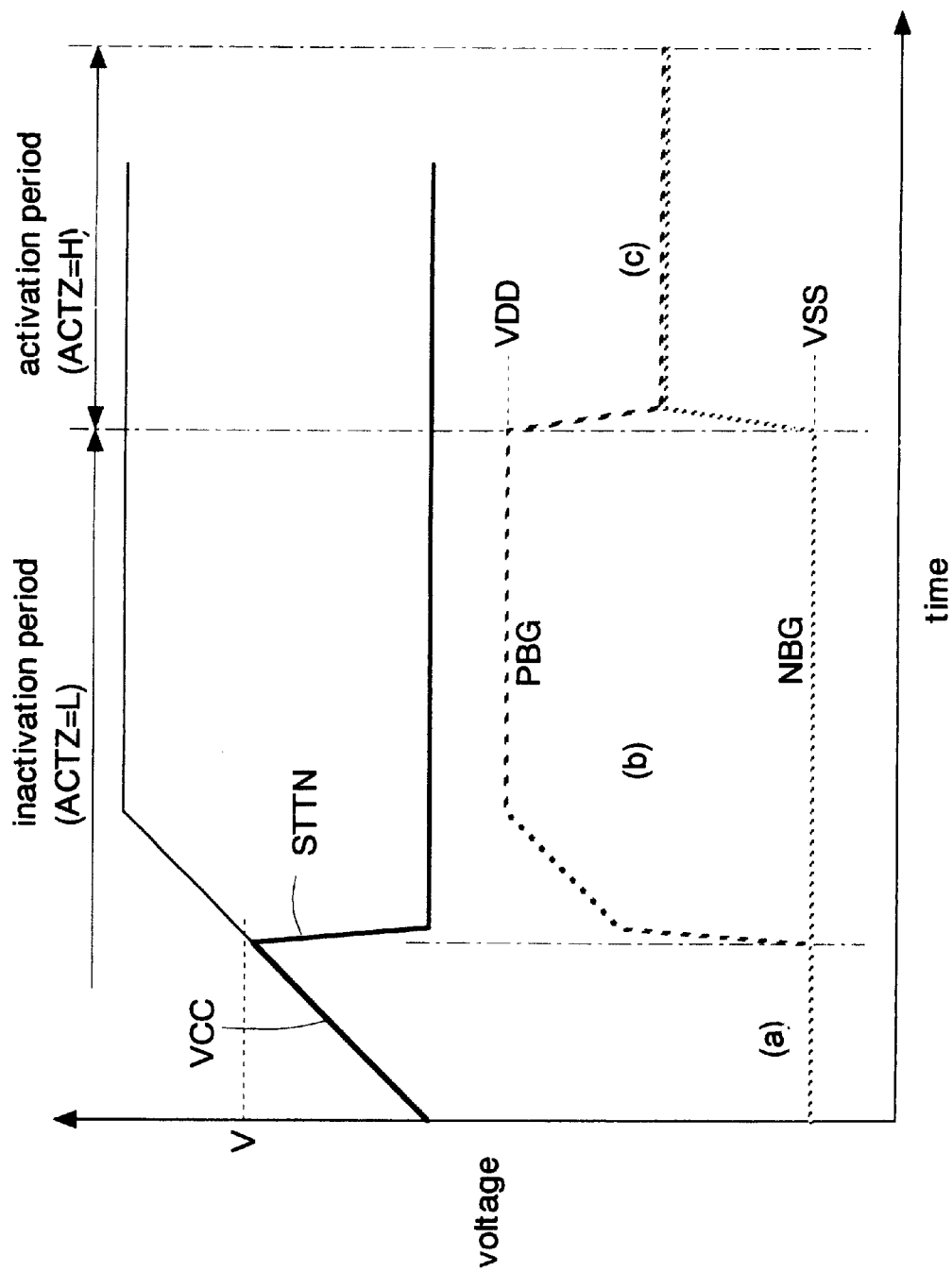
FIG. 16 is a timing chart showing variations of the nodes PBG and NBG upon the turning-on of a power supply.

FIGS. 15 and 16 show a sixth embodiment of the semiconductor integrated circuit in the present invention. The same circuits and signals as those described in the first embodiment will be designated by identical reference numbers. Detailed description thereof will be omitted here. The semiconductor integrated circuit is formed as a DRAM on a p-type silicon substrate by using CMOS processes. This DRAM is supplied with, for example, a power supply voltage VCC of 1 V from exterior.

FIG. 15 shows a switching circuit 30. The configurations excepting the switching circuit 30 are identical to those of the first embodiment described above.

The switching circuit 30 includes a pMOS 30a, a CMOS transmission gate 30b, and an nMOS 30c which are connected in series between an internal power supply line VDD and a ground line VSS. The switching circuit 30 also includes an nMOS 30d, an inverter 30e, and a control circuit 32. The substrate of the pMOS 30a is connected to the internal power supply line VDD. The substrate of the nMOS 30c is connected to the ground line VSS. The source and substrate of the nMOS 30d are connected to the ground line VSS. The node PBG is connected to the drains of the pMOS 30a and the nMOS 30d. The node NBG is connected to the drain of the nMOS 30c. The gate of the nMOS 30d receives a power-on resetting signal STTN.

The control circuit 32 includes an OR circuit 32a which receives the activating signal ACTZ and the power-on resetting signal STTN, and an OR circuit 32b which receives the inverted signal of the activating signal ACTZ and the power-on resetting signal STTN. The OR circuit 32a outputs high level when the power-on resetting signal STTN is at high level. It outputs the same logical level as that of the activating signal ACTZ when the power-on resetting signal STTN is at low level. The OR circuit 32b outputs high level when the power-on resetting signal STTN is at high level. It outputs the inverted logical level of the activating signal ACTZ when the power-on resetting signal STTN is at low level. The output of the OR circuit 32a is connected to the gate of the pMOS 30a and the gate of the nMOS in the CMOS transmission gate 30b. The output of the OR circuit 32b is connected to the gate of the nMOS 30c and the gate of the pMOS in the CMOS transmission gate 30b.

FIG. 16 shows variations of the power-on resetting signal STTN and the nodes PBG, NBG on the occasion when the power supply is supplied to the DRAM.

After the power supply voltage VCC starts to be supplied from exterior, the power-on resetting signal STTN is kept at high level until the voltage VCC reaches a predetermined voltage V. Then, the power-on resetting signal STTN turns to low level. In the high-level period of the power-on resetting signal STTN, predetermined circuits in the DRAM are initialized. For the period where the power-on resetting signal STTN is at high level, the nMOSs 30c and 30d shown in FIG. 15 are turned on so that both the nodes PBG and NBG are connected to the ground line VSS (FIG. 16(a)). Since the ground voltage VSS is supplied to the node PBG, those pMOSs having their substrates connected to the node PBG become lower in threshold voltage than when their substrates are connected to the internal power supply line VDD.

Accordingly, in such cases that the power-on resetting circuit (not shown) uses the threshold voltage of the pMOS to generate the power-on resetting signal STTN, the power-on resetting signal STTN can be securely inactivated when the power supply voltage VCC, even if low, reaches the predetermined voltage V. In other words, the power-on resetting signal STTN can be generated at optimum timing even in a case that the power supply voltage VCC is low.

Subsequently, the DRAM enters a standby state (inactivation period), and the activating signal ACTZ is turned to low level. The power-on resetting signal STTN changes to high level, so that the nMOS 30d and the pMOS 30a are turned off and on, respectively. The nMOS 30c maintains its ON state. The nodes PBG and NBG, as in the first embodiment, are connected to the internal power supply line VDD and the ground line VSS, respectively (FIG. 16(b)).

Next, the DRAM enters an operation state (activation period) and the activating signal ACTZ is turned to high level. The low level of the power-on resetting signal STUN and the high level of the activating signal ACTZ turn the pMOS 30a and the nMOSs 30c, 30d off, and turn the CMOS transmission gate 30b on. The nodes PBG and NBG, as in the first embodiment, are connected to each other so that their voltages fall on a voltage between the internal power supply voltage VDD and the ground voltage VSS (FIG. 16(c)).

This embodiment can offer the same effects as those obtained from the first embodiment described above. Moreover, in this embodiment, the threshold voltages of the pMOSs can be lowered upon the startup of the power supply. Therefore, the power-on resetting signal can be generated with reliability even when the power supply voltage VCC is low.

Note that the embodiments described above have dealt with the examples where the semiconductor integrated circuit is formed on a p-type substrate PSUB. However, the present invention is not limited to such embodiments. For example, the semiconductor integrated circuit may be formed on an n-type substrate or an epitaxial substrate.

Figure 17:
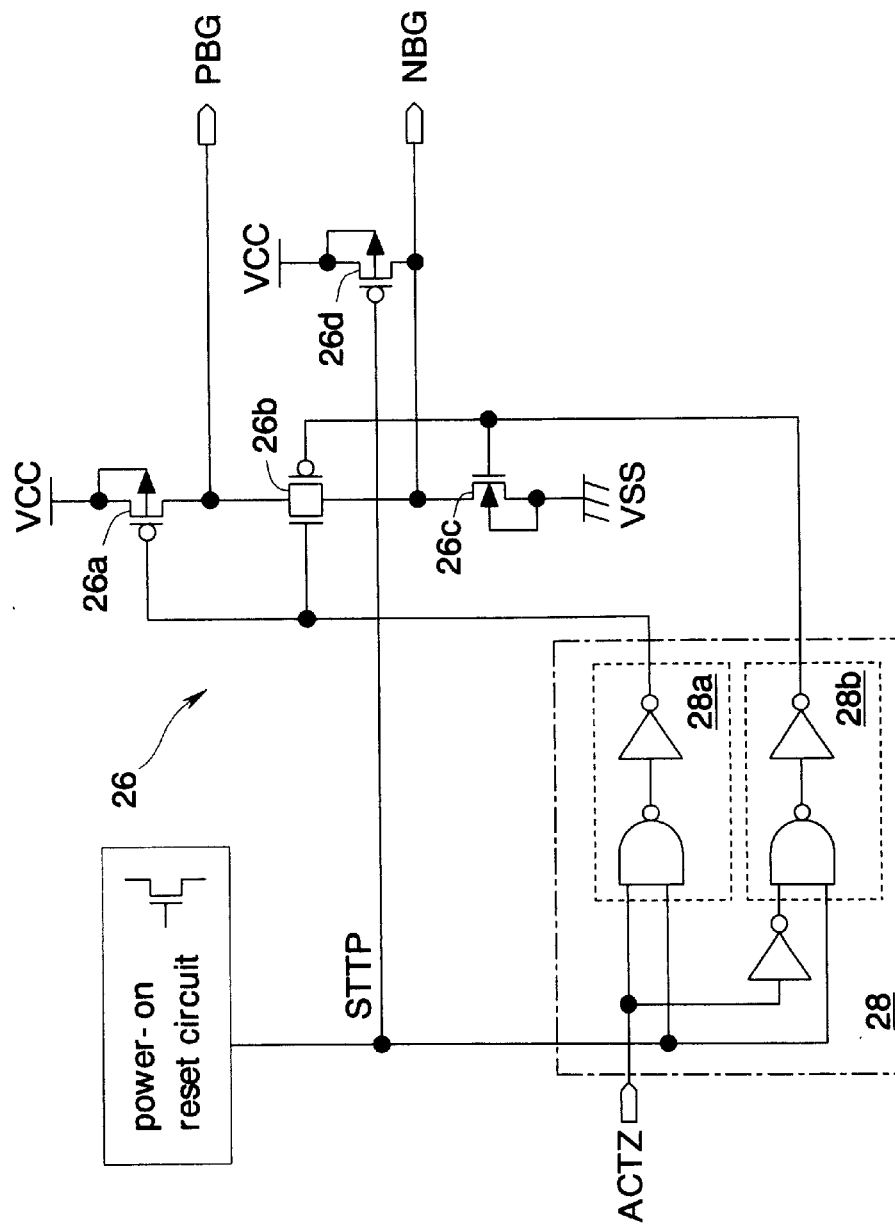
FIG. 17 is a circuit diagram showing a switching circuit according to an embodiment of the semiconductor integrated circuit in the present invention.

The embodiments described above have dealt with the examples where the internal power supply line VDD is connected to the sources of the pMOSs so that the substrates of the pMOSs and nMOSs are changed to between the internal power supply voltage VDD and the ground voltage VSS during the operation periods of the internal circuits. However, the present invention is not limited to such embodiments. For example, as shown in FIG. 17, the power supply line VCC supplied from exterior may be connected to the sources of the pMOSs so that the substrates of the pMOSs and nMOSs are changed to between the power supply voltage VCC and the ground voltage VSS during the operation periods of the internal circuits.

The fifth embodiment described above has dealt with the example where the power-on resetting signal STTP is turned to high level when the power supply voltage VCC supplied from exterior reaches the predetermined voltage V. However, the present invention is not limited to such an embodiment. For example, the signal STTP may be turned to high level when the internal power supply voltage VDD reaches the predetermined voltage V.

Likewise, in the sixth embodiment described above, the power-on resetting signal STTN may be turned to low level when the internal power supply voltage VDD reaches the predetermined voltage V (corresponding to claim 2).

The invention is not limited to the above embodiments and various modifications may be made without departing from the spirit and the scope of the invention. Any improvement may be made in part or all of the components.

What is claimed is:

1. A semiconductor integrated circuit comprising:

a pMOS transistor supplied with a first power supply voltage at a source electrode of said pMOS transistor;

an nMOS transistor supplied with a second power supply voltage at a source electrode of said nMOS transistor, the second power supply voltage being lower than said first power supply voltage;

a first switch circuit for setting substrate voltages of said pMOS and nMOS transistors to values between said first and second power supply voltages during operation periods of said pMOS and nMOS transistors, respectively;

a second switch circuit for setting substrate voltages of said pMOS and nMOS transistors to said first and second power supply voltages during non-operation periods of said pMOS and nMOS transistors, respectively; and a third switch circuit for temporarily supplying a voltage to the substrate of said pMOS transistor when said non-operation periods start, the voltage being higher than said first power supply voltage.

2. The semiconductor integrated circuit according to claim 1, wherein:

said third switch circuit includes a capacitor in which a voltage higher than said first power supply voltage is stored; and said substrate of said pMOS transistor is connected to said capacitor when said non-operation periods start.

3. A semiconductor integrated circuit comprising:

a pMOS transistor being supplied with a first power supply voltage at a source electrode of said pMOS transistor;

an nMOS transistor being supplied with a second power supply voltage at a source electrode of said nMOS transistor, the second power supply voltage being lower than said first power supply voltage;

a first switch circuit for setting substrate voltages of said pMOS and nMOS transistors to values between said first and second power supply voltages during operation periods of said pMOS and nMOS transistors, respectively;

a second switch circuit for setting substrate voltages of said pMOS and nMOS transistors to said first and second power supply voltages during non-operation periods of said pMOS and nMOS transistors, respectively; and a third switch circuit for temporarily supplying a voltage to the substrate of said nMOS transistor when said non-operation periods start, the voltage being lower than said second power supply voltage.

4. The semiconductor integrated circuit according to claim 3, wherein:

said third switch circuit includes a capacitor in which a voltage lower than said second power supply voltage is stored; and said substrate of said nMOS transistor is connected to said capacitor when said non-operational periods start.

* * * * *